United States Patent
Kang et al.

(10) Patent No.: US 11,881,612 B2
(45) Date of Patent: Jan. 23, 2024

(54) HEAT DISSIPATION SHEET AND ELECTRONIC DEVICE INCLUDING SAME

(71) Applicants: Samsung Electronics Co., Ltd., Suwon-si (KR); Amotech Co., Ltd., Incheon (KR)

(72) Inventors: Seunghoon Kang, Suwon-si (KR); Jinhyoung Lee, Incheon (KR); Kyungha Koo, Suwon-si (KR); Jinmyoung Kim, Incheon (KR); Hongki Moon, Suwon-si (KR); Yoonsun Park, Suwon-si (KR); Seyoung Jang, Suwon-si (KR); Seungjae Hwang, Incheon (KR)

(73) Assignees: Samsung Electronics Co., Ltd., Suwon-si (KR); Amotech Co., Ltd., Incheon (KR)

( * ) Notice: Subject to any disclaimer, the term of this patent is extended or adjusted under 35 U.S.C. 154(b) by 247 days.

(21) Appl. No.: 17/402,055

(22) Filed: Aug. 13, 2021

(65) Prior Publication Data

US 2021/0391636 A1 Dec. 16, 2021

Related U.S. Application Data

(63) Continuation of application No. PCT/KR2020/001586, filed on Feb. 3, 2020.

(30) Foreign Application Priority Data

Feb. 15, 2019 (KR) .................. 10-2019-0018147

(51) Int. Cl.
*H01Q 1/02* (2006.01)
*H01Q 1/24* (2006.01)

(52) U.S. Cl.
CPC .............. *H01Q 1/02* (2013.01); *H01Q 1/24* (2013.01)

(58) Field of Classification Search
CPC H01Q 1/02; H01Q 1/24; H01Q 1/243; H01Q 1/2284
See application file for complete search history.

(56) References Cited

U.S. PATENT DOCUMENTS

2015/0155614 A1  6/2015  Youn et al.
2016/0248278 A1  8/2016  Ebe et al.
(Continued)

FOREIGN PATENT DOCUMENTS

KR  10-2015-0064566 A  6/2015
KR  10-2017-0030043 A  3/2017
(Continued)

OTHER PUBLICATIONS

International Search Report dated May 12, 2020 in connection with International Patent Application No. PCT/KR2020/001586, 2 pages.
(Continued)

*Primary Examiner* — Lam T Mai

(57) ABSTRACT

An electronic device according to various embodiments of the present disclosure can comprise: a front plate facing a first direction; a rear plate facing a second direction, which is opposite to the first direction; at least one antenna module arranged between the front plate and the rear plate; and at least one heat dissipation sheet spaced from the at least one antenna module so as to be arranged to come in contact with the rear plate. The at least one heat dissipation sheet can comprise a ceramic filler and a binder resin mixed with the ceramic filler.

15 Claims, 17 Drawing Sheets

(56) References Cited

U.S. PATENT DOCUMENTS

| | | | |
|---|---|---|---|
| 2017/0067160 A1 | 3/2017 | Kato et al. | |
| 2017/0077727 A1 | 3/2017 | Kim et al. | |
| 2018/0198487 A1 | 7/2018 | Kim | |
| 2019/0221353 A1 | 7/2019 | Hwang | |
| 2019/0319341 A1* | 10/2019 | Park | H01Q 21/065 |
| 2020/0021015 A1* | 1/2020 | Yun | H01Q 1/2283 |
| 2020/0267828 A1* | 8/2020 | Moon | H02J 50/20 |
| 2021/0057812 A1* | 2/2021 | Yun | H01Q 21/06 |
| 2021/0391636 A1* | 12/2021 | Kang | H01Q 1/2283 |
| 2022/0322516 A1* | 10/2022 | Kim | H01Q 1/243 |

FOREIGN PATENT DOCUMENTS

| | | |
|---|---|---|
| KR | 10-2017-0032861 A | 3/2017 |
| KR | 10-1762030 B1 | 7/2017 |
| KR | 10-2017-0109257 A | 9/2017 |
| KR | 10-2017-0130230 A | 11/2017 |
| KR | 10-2018-0082989 A | 7/2018 |
| KR | 10-2019-0008128 A | 1/2019 |

OTHER PUBLICATIONS

Written Opinion of the International Searching Authority dated May 12, 2020 in connection with International Patent Application No. PCT/KR2020/001586, 6 pages.

Office Action dated Nov. 27, 2023, in connection with Korean Patent Application No. 10-2019-0018147, 17 pages.

\* cited by examiner

HEAT DISSIPATION SHEET AND ELECTRONIC DEVICE INCLUDING SAME

CROSS-REFERENCE TO RELATED APPLICATIONS

This application is a continuation of International Application No. PCT/KR2020/001586 filed on Feb. 20, 2020, which claims priority to Korean Patent Application No. 10-2019-0018147 filed on Feb. 15, 2019, the disclosures of which are herein incorporated by reference in their entirety.

BACKGROUND

1. Field

Various embodiments relate to a heat dissipation sheet and an electronic device including the same.

2. Description of Related Art

Electronic devices may output information stored therein as sound or an image. As the degree of integration of electronic devices has increased and super-high-speed and large-capacity wireless communication has become popular, multiple functions have recently come to be provided in a single electronic device, such as a mobile communication terminal. For example, various functions, such as an entertainment function (e.g., a game function), a multimedia function (e.g., a music/video reproduction function), a communication and security function for mobile banking or the like, a schedule management function, and an e-wallet function, are integrated in a single electronic device, in addition to a communication function.

In communication devices mounted in electronic devices, efforts are underway to develop a next generation communication system such as a next generation (e.g., $5^{th}$-generation) communication system or a pre-next generation communication system in order to meet the growing demand for wireless data traffic, which is in an increasing trend after the commercialization of a 4G ($4^{th}$-generation) communication system.

In order to achieve a high data transmission rate, the next generation communication system is being implemented in an ultra-high-frequency band (e.g., a band of 6 GHz or higher and 300 GHz or lower) such as a millimeter (mm) wave band. In order to mitigate a path loss of radio waves and to increase a transmission distance of radio waves in the ultra-high-frequency band, beam-forming technology, massive multi-input multi-output (massive MIMO) technology, full dimensional MIMO (FD-MIMO) technology, antenna array technology, analog beam-forming technology, and large-scale antenna technology are being developed in the next generation communication system.

Electronic devices having a communication function, such as a portable terminal, are being reduced in size and weight in order to increase portability and convenience for users, and integrated components are being mounted in a smaller space for high performance. Accordingly, components used in electronic devices (e.g., next-generation (e.g., $5^{th}$-generation) communication systems or pre-next-generation communication systems) have a higher heating temperature due to the high performance, and the increased heating temperature affects adjacent components, which may result in degradation of the overall performance of the electronic devices. In addition, although various heat dissipation materials have been applied to electronic devices in order to suppress performance degradation due to heating, materials known to have high heat dissipation performance may have a high dielectric constant, thereby adversely affecting wireless signals for communication.

SUMMARY

An electronic device according to various embodiments of the disclosure may include: a front plate oriented in a first direction; a rear plate oriented in a second direction opposite to the first direction; at least one antenna module disposed between the front plate and the rear plate; and at least one heat dissipation sheet spaced apart from the at least one antenna module and adhesively disposed on the rear plate. The at least one heat dissipation sheet may include a ceramic filler, and a binder resin mixed with the ceramic filler.

An electronic device according to various embodiments may include: a housing including a front plate oriented in a first direction, a rear plate oriented in a second direction opposite to the first direction, and a side member surrounding a space between the front plate and the rear plate and at least partially formed of a metal material; a display visible through a portion of the front plate; at least one antenna module located in the space; and at least one heat dissipation sheet disposed between the at least one antenna module and the rear plate. The at least one heat dissipation sheet may include a ceramic filler, and a binder resin mixed with the ceramic filler.

A heat dissipation sheet according to various embodiments of the disclosure may include a ceramic filler, a high heat dissipation filler including a core including a material having higher thermal conductivity than the ceramic filler and an insulating coating layer formed to surround at least a portion of the surface of the core, and a binder resin.

According to various embodiments of the disclosure, it is possible to provide an electronic device with a heat dissipation sheet that dissipates heat generated by various electronic components disposed therein.

According to various embodiments of the disclosure, it is possible to provide a heat dissipation sheet that suppress heating in an electronic device and has a low dielectric constant, and an electronic device including the same.

According to various embodiments of the disclosure, it is possible to provide an electronic device with a heat dissipation sheet that is disposed adjacent to an antenna module (e.g., RFIC or PMIC) so as to dissipate heat generated by the same. In addition, the heat dissipation sheet is capable of preventing the efficiency of the wireless communication signal of the antenna module from being deteriorated by including a low dielectric constant material.

With the electronic device according to various embodiments, it is possible to provide an arrangement and configuration of heat dissipation members for efficiently dissipating the heat generated by the antenna module.

However, problems to be solved in this disclosure are not limited to those described above, and may be variously expanded without departing from the spirit and scope of this disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 16, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
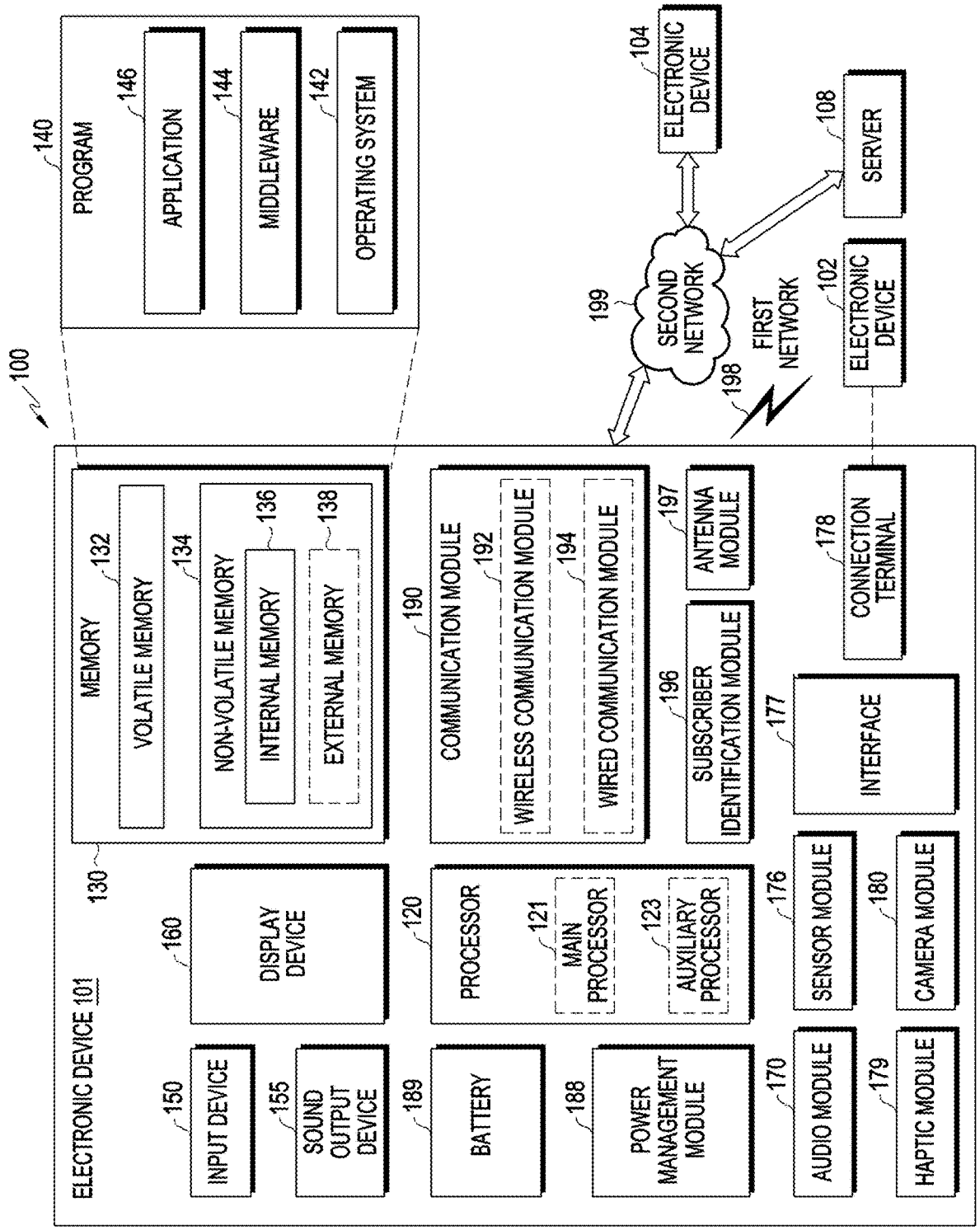
FIG. 1 illustrates block diagram of an electronic device according to various embodiments of the disclosure in a network environment.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by a component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image and moving images. According to an embodiment, the camera module 180 may include one or more lenses, image sensors, image signal processors, or flashes.

The power management module 188 may manage power supplied to the electronic device 101. According to one embodiment, the power management module 388 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and support a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and at least one antenna appropriate for a communication scheme used in the communication network, such as the first network 198 or the second network 199, may be selected, for example, by the communication module 190 from the one or more antennas. The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., a program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAYTORE), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
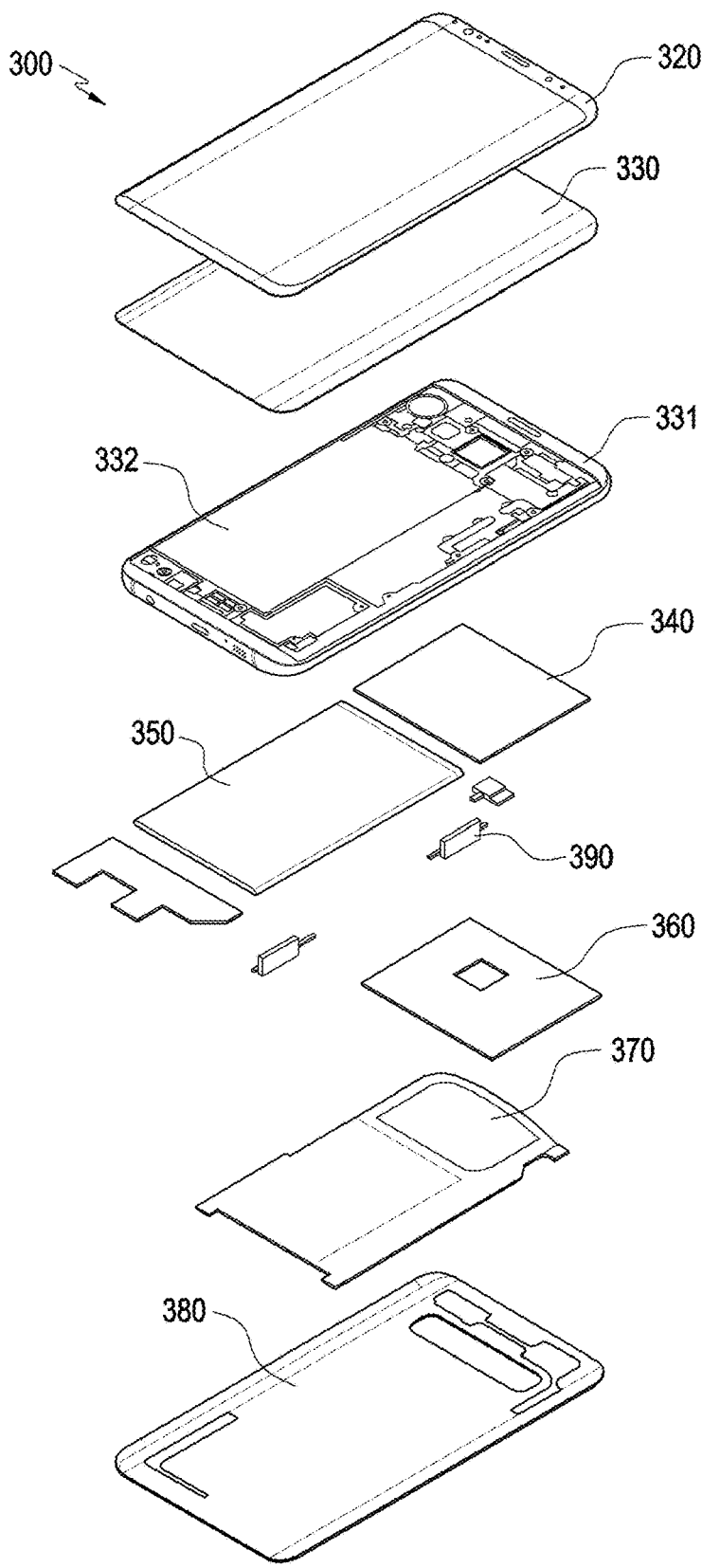
FIG. 2 illustrates an exploded perspective view illustrating an electronic device according to various embodiments of the disclosure.

FIG. 2 illustrates an exploded perspective view illustrating an electronic device 101 according to various embodiments.

Referring to FIG. 2, an electronic device 101 (e.g., the electronic device 101 in FIG. 1) may include a side bezel structure 331, a first support member 332 (e.g., a bracket), a front plate 320, a display 330, a printed circuit board 340, a battery 350, a second support member 360 (e.g., a rear case), an antenna 370, and a rear plate 380. In some embodiments, at least one of the components (e.g., the first support member 332 or the second support member 360) may be omitted from the electronic device 101, or other components may be additionally included in the electronic device 101.

According to an embodiment, the first support member 332 may be disposed inside the electronic device 101 so as to be connected to the side bezel structure 331, or may be integrally configured with the side bezel structure 331. The first support member 332 may be made of, for example, a metal material and/or a non-metal material (e.g., a polymer). The display 330 may be coupled to one surface of the first support member 332, and the printed circuit board 340 may be coupled to the other surface of the first support member 332. On the printed circuit board 340, a processor, a memory, and/or an interface may be mounted. The processor may include at least one of, for example, a central processing unit, an application processor, a graphics processor, an image signal processor, a sensor hub processor, or a communication processor.

According to an embodiment, the memory may include, for example, a volatile memory or a nonvolatile memory.

According to an embodiment, the interface may include, for example, a high-definition multimedia interface (HDMI), a universal serial bus (USB) interface, an SD card interface, and/or an audio interface. The interface may electrically or physically connect, for example, the electronic device 101 to an external electronic device, and may include a USB connector, an SD card/MMC connector, or an audio connector.

According to an embodiment, at least a portion of the first surface of the electronic device may be defined by a substantially transparent front plate 320 (e.g., a glass plate or a polymer plate including various coating layers). The rear surface of the electronic device may be made of a substantially opaque rear plate (e.g., coated or colored glass, ceramic, a polymer, a metal (e.g., aluminum, stainless steel (STS), or magnesium), or a combination of two or more of these materials). The side surface may be defined by a side bezel structure 331 coupled to the front plate 320 and the rear plate 380 and including a metal and/or a polymer. In some embodiments, the rear plate 380 and the side bezel structure 331 may be integrally configured, and may include the same material (e.g., a metal material such as aluminum).

According to an embodiment, the display 330 may be exposed through a substantial portion of, for example, the front plate 320. In some embodiments, the edges of the display 330 may be configured to be substantially the same as the shape of the periphery of the front plate 320 adjacent thereto. In another embodiment (not illustrated), the distance between the periphery of the display 330 and the periphery of the front plate 320 may be substantially constant in order to enlarge the exposed area of the display 330.

According to an embodiment, the battery 350 is a device for supplying power to at least one component of the electronic device 101, and may include, for example, a non-rechargeable primary battery, a rechargeable secondary battery, or a fuel cell. At least a portion of the battery 350 may be disposed on substantially the same plane as, for example, the printed circuit board 340. The battery 350 may be integrally disposed inside the electronic device 101, or may be detachably disposed on the electronic device 101.

According to an embodiment, the antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with, for example, an external electronic device, or may transmit/receive power for charging to/from the external device in a wireless manner. In another embodiment, an antenna structure may be formed by a portion of the side bezel structure 331, a portion of the first support member 332, or a combination thereof.

According to various embodiments, the electronic device may include an antenna module 390. For example, a part of the multiple antenna module 390 may be implemented in order to transmit and receive radio waves having different characteristics (provisionally referred to as radio waves of frequency bands A and B) for MIMO implementation. As another example, a part of the antenna module 390 may be configured, for example, to simultaneously transmit and receive radio waves having the same characteristics (provisionally referred to as radio waves having frequencies A1 and A2 in the frequency band A) for the purpose of diversity implementation. As another example, another part of the antenna module 390 may be configured, for example, to simultaneously transmit and receive radio waves having the same characteristics (provisionally referred to as radio waves having frequencies B1 and B2 in the frequency band B) for diversity implementation. In an embodiment of the disclosure, the electronic device 101 may include two antenna modules, but, in another embodiment of the disclosure, the electronic device 101 may include four antenna modules so as to simultaneously implement MIMO and diversity. In still another embodiment, the electronic device 101 may include one antenna module 390.

According to an embodiment, in consideration of the transmission/reception characteristics of radio waves, when one antenna module is disposed at a first position on the printed circuit board 340, another antenna module may be disposed at a second position, which is separated from the first position on the printed circuit board 340. As another example, one antenna module and another antenna module may be arranged in consideration of the mutual separation distance between the one antenna module and the another antenna module according to a diversity characteristic.

According to an embodiment, the antenna module 390 may include an RF communication circuit that processes radio waves transmitted/received in an ultra-high-frequency band (e.g., 6 GHz or higher and 300 GHz or lower). A conductive plate of the antenna module 390 may include, for example, a patch-type radiation conductor or a conductive plate having a dipole structure extending in one direction. Multiple conductive plates may be arrayed so as to form an antenna array. For example, a chip in which a part of the RF communication circuit is implemented (e.g., an integrated circuit chip) may be disposed on one side of the area in which the conductive plate is disposed or on the face that faces away from the face on which the conductive plate is disposed, and may be electrically connected to the conductive plate via wiring made of a printed circuit pattern.

Figure 3:
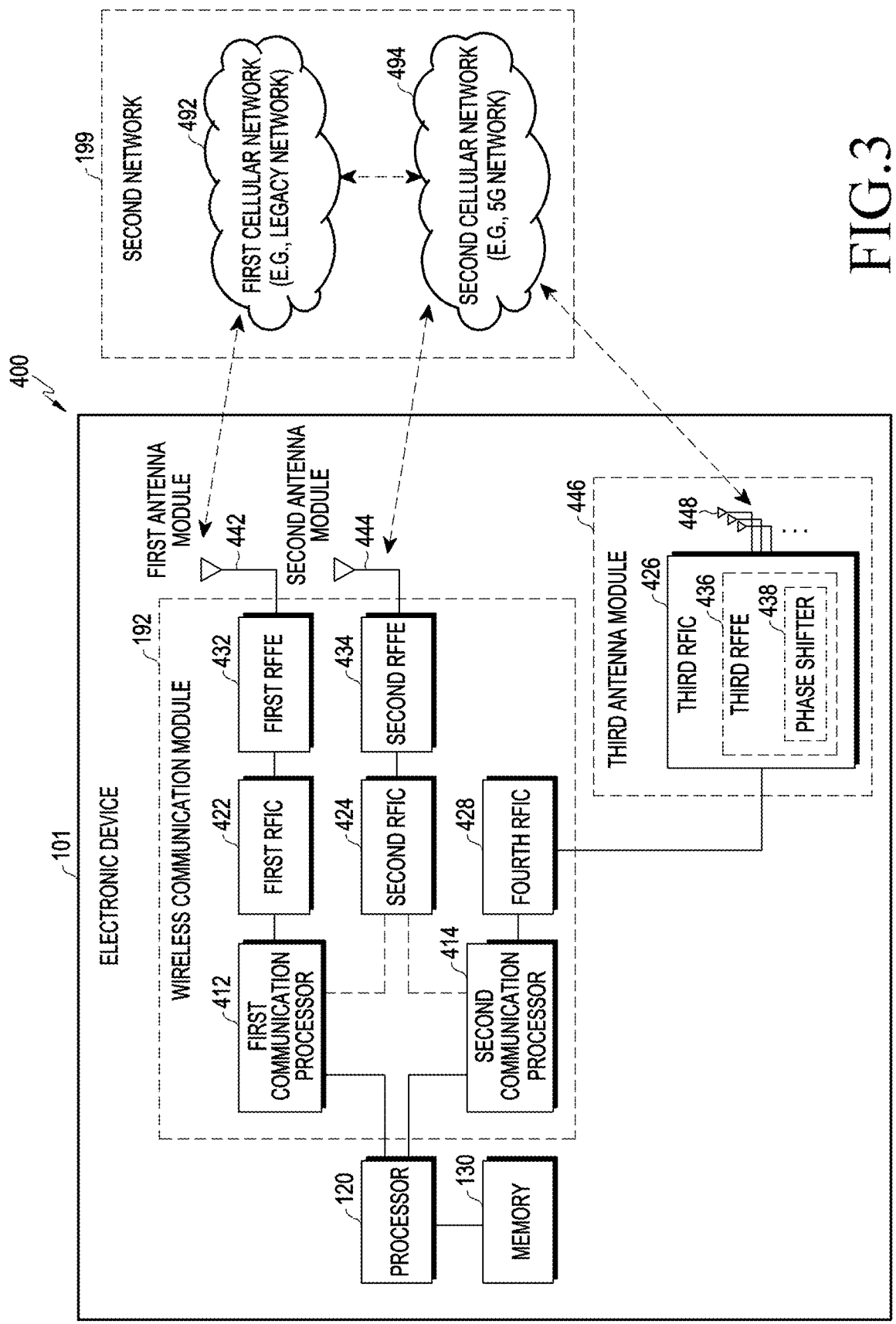
FIG. 3 illustrates a block diagram of an electronic device according to various embodiments of the disclosure in a network environment including multiple cellular networks.

FIG. 3 illustrates a block diagram 400 of an electronic device 101 according to various embodiments in a network environment including multiple cellular networks.

Referring to FIG. 3, the electronic device 101 may include a first communication processor 412, a second communication processor 414, a first radio-frequency integrated circuit (RFIC) 422, a second RFIC 424, a third RFIC 426, a fourth RFIC 428, a first radio-frequency front end (RFFE) 432, a second RFFE 434, a first antenna module 442, a second antenna module 444, and an antenna 448. The electronic device 101 may further include a processor 120 and a memory 130. The second network 199 may include a first cellular network 492 and a second cellular network 494. According to another embodiment, the electronic device 101 may further include at least one of the components illustrated in FIG. 2, and the second network 199 may further include one or more other networks. According to an embodiment, the first communication processor 412, the second communication processor 414, the first RFIC 422, the second RFIC 424, the fourth RFIC 428, the first RFFE 432, and the second RFFE 434 may form at least a portion of an wireless communication module 192. According to another embodiment, the fourth RFIC 428 may be omitted, or may be included as a part of the third RFIC 426.

According to various embodiments, the first communication processor 412 may establish a communication channel in a band to be used for RF communication with the first cellular network 492, and may support legacy network communication via the established communication channel. According to various embodiments, the first cellular network may be a legacy network including a second-generation (4G), 3G, 4G, or long-term evolution (LTE) network.

The second communication processor 414 may establish a communication channel corresponding to a predetermined band (e.g., about 6 GHz to about 60 GHz) in a band to be used for RF communication with the second cellular network 494, and may support 5G network communication via the established communication channel. According to various embodiments, the second cellular network 494 may be a 5G network defined in the 3GPP. In addition, according to an embodiment, the first communication processor 412 or the second communication processor 414 may establish a communication channel corresponding to another predetermined band (e.g., about 6 GHz or lower) in the band to be used for RF communication with the second cellular network 494, and may support 5G network communication through the established communication channel. According to an embodiment, the first communication processor 412 and the second communication processor 414 may be implemented in a single chip or in a single package. According to various embodiments, the first communication processor 412 or the second communication processor 414 may be formed in a single chip or a single package with the processor 120, an auxiliary processor 123, or a communication module 190.

According to an embodiment, during transmission, the first RFIC 422 may convert a baseband signal generated by the first communication processor 412 into an RF signal of about 700 MHz to about 3 GHz to be used in the first cellular network 492 (e.g., a legacy network). During reception, an RF signal may be acquired from the first cellular network 492 (e.g., the legacy network) through an antenna (e.g., the first antenna module 442), and may be pre-processed through an RFFE (e.g., the first RFFE 432). The first RFIC 422 may convert the pre-processed RF signal into a baseband signal to be processed by the first communication processor 412.

According to an embodiment, during transmission, the second RFIC 424 may convert the baseband signal generated by the first communication processor 412 or the second communication processor 414 into an RF signal in a Sub6 band (e.g., about 6 GHz or lower) (hereinafter, referred to as "5G sub6 RF signal") to be used in the second cellular network 494 (e.g., a 5G network). During reception, the 5G Sub6 RF signal may be acquired from the second cellular network 494 (e.g., a 5G network) through an antenna (e.g., the second antenna module 444), and may be pre-processed through an RFFE (e.g., the second RFFE 434). The second RFIC 424 may convert the pre-processed 5G Sub6 RF signal into a baseband signal so as to be processed by a corresponding one of the first communication processor 412 and the second communication processor 414.

According to an embodiment, the third RFIC 426 may convert the baseband signal generated by the second communication processor 414 into an RF signal in a 5G Above6 band (e.g., about 6 GHz to about 60 GHz) (hereinafter, referred to as a "5G Above6 RF signal") to be used in the second cellular network 494 (e.g., a 5G network). During reception, the 5G Above6 RF signal may be acquired from the second cellular network 494 (e.g., a 5G network) through an antenna (e.g., the second antenna 448), and may be pre-processed through the third RFFE 436. The third RFIC 426 may convert the pre-processed 5G Above6 RF signal into a baseband signal to be processed by the second communication processor 414. According to an embodiment, the third RFFE 436 may be formed as a part of the third RFIC 426.

According to an embodiment, the electronic device 101 may include a fourth RFIC 428 separately from or as at least a part of the third RFIC 426. In this case, the fourth RFIC 428 may convert the baseband signal generated by the second communication processor 414 into an RF signal (hereinafter, referred to as an "IF signal") in an intermediate-frequency band (e.g., about 9 GHz to about 11 GHz), and may then deliver the IF signal to the third RFIC 426. The third RFIC 426 may convert the IF signal into a 5G Above6 RF signal. During reception, the 5G Above6 RF signal may be acquired from the second cellular network 494 (e.g., a 5G network) through an antenna (e.g., the antenna 448), and may be converted into an IF signal through the third RFIC 426. The fourth RFIC 428 may convert the IF signal into a baseband signal to be capable of being processed by the second communication processor 414.

According to an embodiment, the first RFIC 422 and the second RFIC 424 may be implemented as at least a part of a single chip or a single package. According to an embodiment, the first RFFE 432 and the second RFFE 434 may be implemented as at least a portion of a single chip or a single package. According to an embodiment, at least one of the first antenna module 442 and the second antenna module 444 may be omitted, or may be combined with another antenna module so as to process RF signals of multiple corresponding bands.

According to an embodiment, the third RFIC 426 and the antenna 448 may be disposed on the same substrate so as to form a third antenna module 446. For example, the wireless communication module 192 or the processor 120 may be placed on a first substrate (e.g., a main PCB). In such a case, the third RFIC 426 may be disposed on a partial area (e.g., a lower face) of a second substrate (e.g., a sub-PCB) separate from the first substrate, and the antenna 448 may be disposed on another partial area (e.g., an upper face), thereby forming the third antenna module 446. By disposing the third RFIC 426 and the antenna 448 on the same substrate, it is possible to reduce the length of the transmission line therebetween. Through this, it is possible to reduce the loss (e.g., attenuation) of a signal in a high-frequency band (e.g., about 6 GHz to about 60 GHz) to be used for, for example, 5G network communication by the transmission line. As a result, the electronic device 101 is able to improve the quality or speed of communication with the second cellular network 494 (e.g., a 5G network).

According to an embodiment, the antenna 448 may be formed as an antenna array that includes multiple antenna elements capable of being used for beamforming. In this case, the third RFIC 426 may include multiple phase converters 438 corresponding to the multiple antenna elements, for example, as a part of the third RFFE 436. During transmission, each of the multiple phase converters 438 may convert the phase of a 5G Above6 RF signal to be transmitted to the outside of the electronic device 101 (e.g., a base station of a 5G network) through a corresponding antenna element. During reception, each of the multiple phase converters 438 may convert the phase of the 5G Above6 RF signal received from the outside into the same or substantially the same phase through the corresponding antenna element. This enables transmission or reception through beamforming between the electronic device 101 and the outside.

According to various embodiments, the second cellular network 494 (e.g., a 5G network) may be operated independently from the first cellular network 492 (e.g., a legacy network) (e.g., Stand Alone (SA)), or may be operated in the state of being connected to the first cellular network 492 (e.g., Non-Stand Alone (NSA)). For example, in a 5G network, an access network (e.g., a 5G radio access network (RAN) or a next-generation RAN (NG RAN)) may exist but a core network (e.g., a next-generation core (NGC)) may not exist. In this case, after accessing the access network of the 5G network, the electronic device 101 may access an external network (e.g., the Internet) under the control of the core network (e.g., an evolved packed core (EPC)) of a legacy network. Protocol information for communication with a legacy network (e.g., LTE protocol information) or protocol information for communication with a 5G network (e.g., new radio (NR) protocol information) may be stored in the memory 430, and may be accessed by another component (e.g., the processor 120, the first communication processor 412, or the second communication processor 414).

FIGS. 4A to 4D illustrate the structure of an electronic device including an antenna module according to various embodiments of the disclosure.

Referring to FIGS. 4A to 4D, the electronic device 101 may include a housing 510 including a first plate 520 (e.g., the front plate 320 in FIG. 2), a second plate 530 (e.g., the rear plate 380 or a rear glass in FIG. 2) spaced apart from the first plate and facing away from the first plate 520, and a side member 540 surrounding the space between the first plate 520 and the second plate 530.

According to various embodiments, the first plate 520 may include a transparent material including a glass plate. The second plate 530 may include a non-conductive material and/or a conductive material. In addition, the side member 540 may include a conductive material and/or a non-conductive material. In some embodiments, at least a portion of the side member 540 may be formed integrally with the second plate 530. In the illustrated embodiment, the side member 540 may include first to third insulating portions 541, 543, and 545 and first to third conductive portions (legacy antennas) 551, 553, and 555.

According to various embodiments, within the space, the electronic device 101 may include a display disposed to be visible through the first plate 520, a main printed circuit board (PCB) 570, and/or a mid-plate (not illustrated), and may optionally further include various other components.

According to an embodiment, the electronic device 101 may include a first legacy antenna 551, a second legacy antenna 553, and a third legacy antenna 555 in the space and/or on a portion of the housing 510 (e.g., the side member 540). The first to third legacy antennas 551, 553, and 555 may be used for, for example, cellular communication (e.g., $2^{nd}$-generation (2G), 3G, 4G, or LTE), nearfield communication (e.g., Wi-Fi, Bluetooth, or NFC), and/or global navigation satellite system (GNSS).

According to various embodiments, the electronic device 101 may include a first antenna assembly 561, a second antenna assembly 563, and a third antenna assembly 565 for forming a directional beam. The antenna assemblies 561, 563, and 565 may be used for 5G network (e.g., the second cellular network 494 in FIG. 5) communication, mmWave communication, 60 GHz communication, or WiGig communication. The antenna assemblies 561, 563, and 565 may be disposed in the space so as to be spaced apart from metal members of the electronic device 101 (e.g., the housing 510, an internal component 573, and/or the first to third legacy antennas 551, 553, and 555) by a predetermined interval or more.

According to various embodiments, the first antenna assembly 561 may be located at the upper end of the left side (−Y axis), the second antenna assembly 563 may be located at the middle of the upper end (X axis), and the third antenna assembly 565 may be located at the middle of the right side (Y axis). In another embodiment, the electronic device 101 may include additional antenna modules at additional positions (e.g., at the middle of the lower end (−X axis)), or some of the first to third antenna assembly 561, 563, and 565 may be omitted. According to an embodiment, the first to third antenna assembly 561, 563, and 565 may be electrically connected to at least one communication processor (e.g., the processor 120 in FIG. 1) on the main printed circuit board 570 using a conductive line 571 (e.g., a coaxial cable or an FPCB).

Figure 4A:
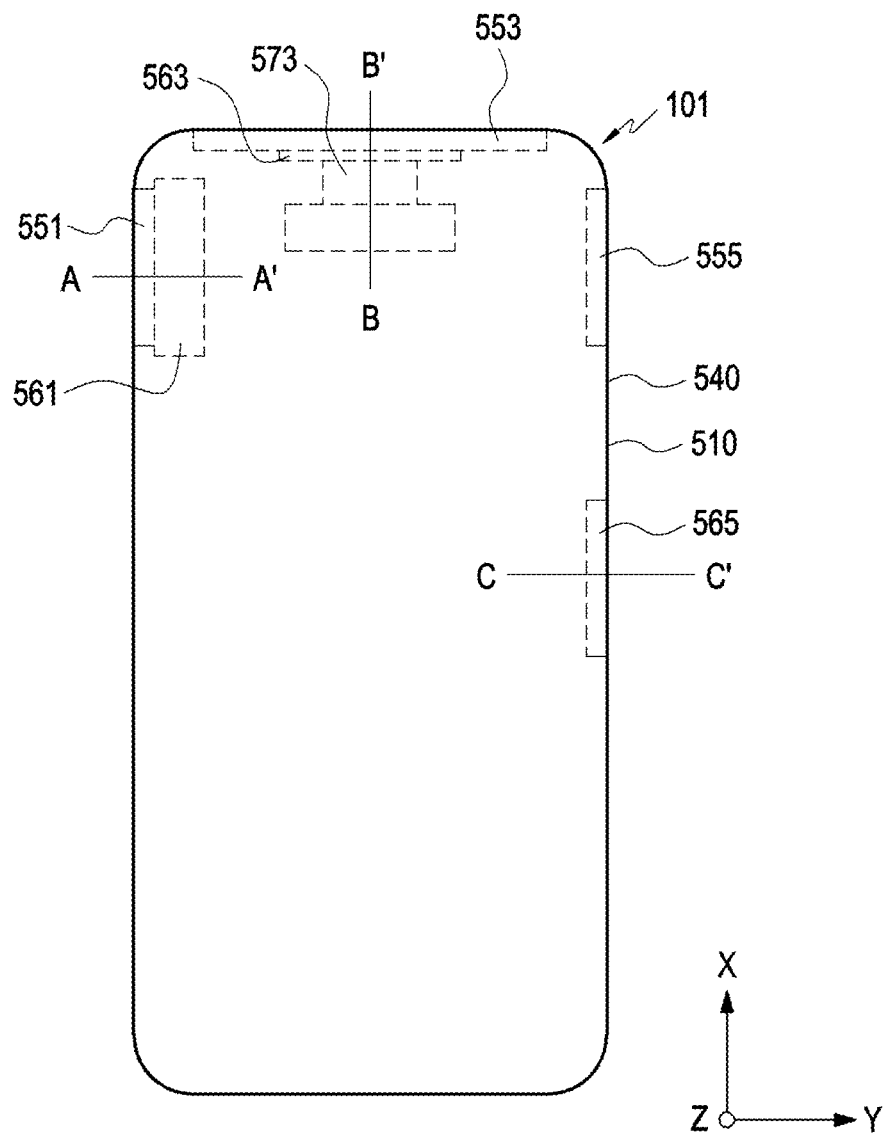
FIGS. 4A to 4D illustrate the structure of an electronic device including an antenna module according to various embodiments of the disclosure.
Figure 4B:
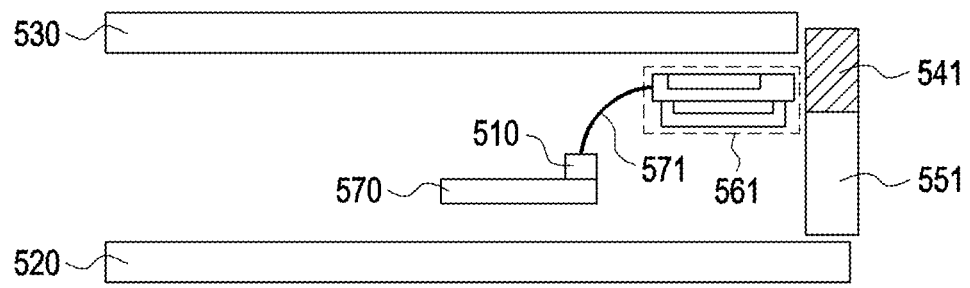
Figure 4C:
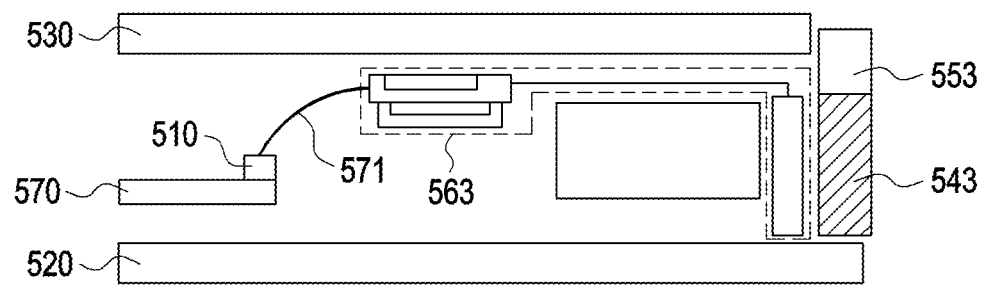

Referring to FIG. 4B, which illustrates a cross section taken along line A-A' in FIG. 4A, some (e.g., a patch antenna array) of the antenna arrays of the first antenna assembly 561 may be disposed to emit radiation toward the second plate 530, and remaining ones (e.g., a dipole antenna array) of the antenna arrays may be disposed to emit radiation through the first insulating portion 541. Referring to FIG. 4C, which illustrates a cross section taken along line B-B' in FIG. 4A, some (e.g., a patch antenna array) of the radiators of the second antenna assembly 563 may be disposed to emit radiation toward the second plate 530, and remaining ones (e.g., a dipole antenna array) of the radiators may be disposed to emit radiation through the second insulating portion 543.

According to various embodiments, the second antenna assembly 563 may include a plurality of printed circuit boards. For example, some (e.g., a patch antenna array) of the antenna arrays and remaining ones (e.g., a dipole antenna array) of the antenna arrays may be located on different printed circuit boards. According to an embodiment, the printed circuit boards may be connected via a flexible printed circuit board. The flexible printed circuit board may be disposed in the vicinity of an internal component 573 (e.g., a receiver, a speaker, sensors, a camera, an ear jack, or a button).

Figure 4D:
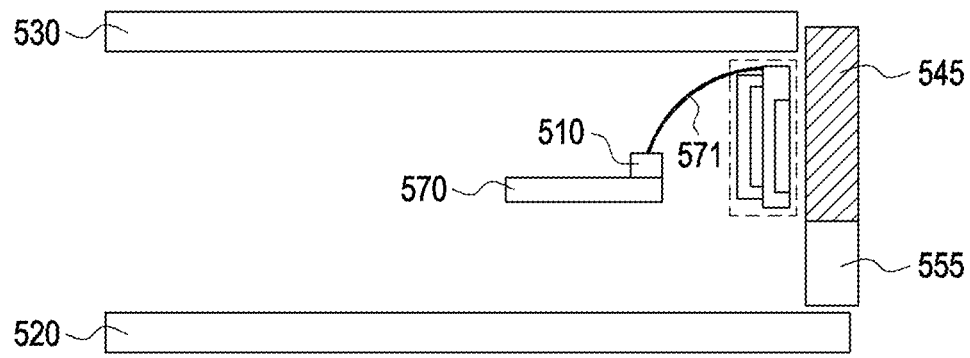

Referring to FIG. 4D, which illustrates a cross section taken along line C-C' in FIG. 4A, the third antenna assembly 565 may be disposed to face the side member 540 of the housing 510. Some (e.g., a dipole antenna array) of the antenna arrays of the third antenna assembly 565 may be disposed to emit radiation toward the second plate 530, and remaining ones (e.g., a patch antenna array) of the antenna arrays may be disposed to emit radiation through the third insulating portion 545.

Figure 5A:
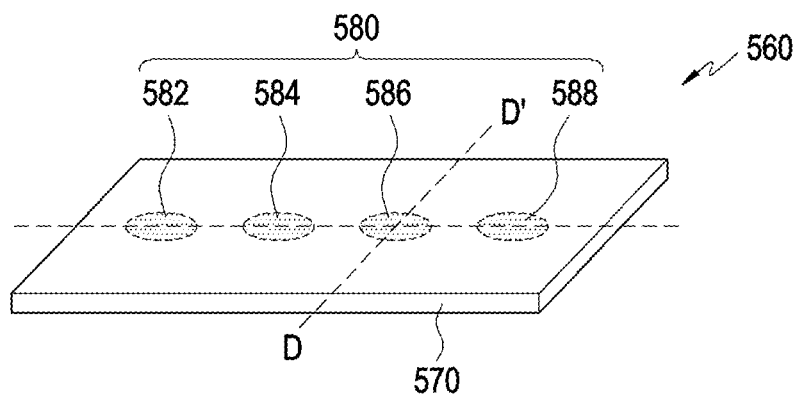
FIGS. 5A to 5C illustrates the structure of an antenna assembly according to various embodiments of the disclosure.
Figure 5B:
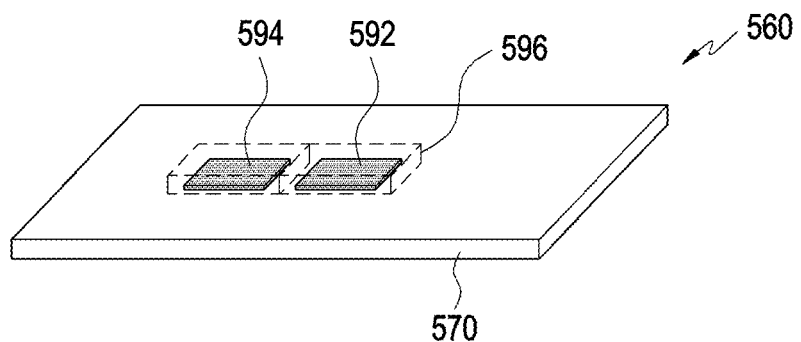
Figure 5C:
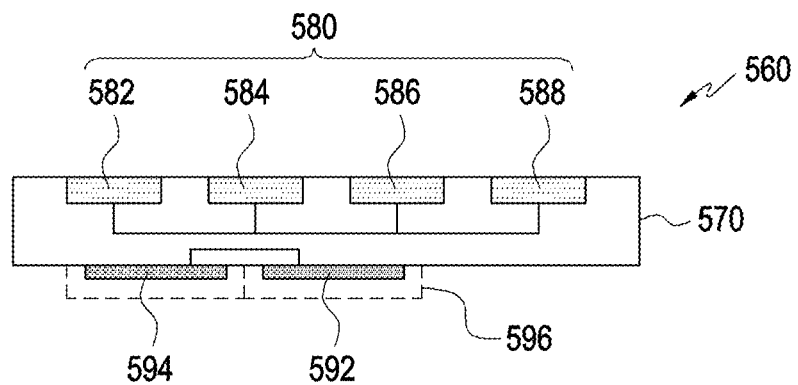

FIGS. 5A to 5C illustrates the structure of an antenna assembly according to various embodiments of the disclosure. FIG. 5A is a perspective view of an antenna assembly viewed from one side, FIG. 5B is a perspective view of the antenna assembly viewed from another side, and FIG. 5C is a cross-sectional view of the antenna assembly, taken along line D-D'.

Referring to FIGS. 5A to 5C, according to an embodiment, the antenna assembly 560 may include a printed circuit board 570, an antenna array 580, a radio-frequency integrated circuit (RFIC) 592, and a power management integrated circuit (PMIC) 594. Alternatively, the third antenna assembly 560 may further include a shield member 596. In other embodiments, at least one of the above-mentioned components may be omitted, or at least two of the components may be integrally formed.

According to various embodiments, the printed circuit board 570 may include multiple conductive layers and multiple non-conductive layers stacked alternately with the conductive layers. The printed circuit board 570 may provide electrical connection between various electronic components disposed in the printed circuit board 570 and/or outside the first printed circuit board 570 using wiring lines and conductive vias formed in the conductive layers.

According to various embodiments, the antenna array 580 may include a plurality of antenna elements 582, 584, 586, or 588 arranged to form directional beams. As illustrated, the antenna elements may be disposed on the first surface of the printed circuit board 570. According to another embodiment, the antenna array 580 may be disposed inside the printed circuit board 570. According to embodiments, the antenna array 580 may include multiple antenna arrays, which are different or the same in shape or type (e.g., dipole antenna arrays and/or patch antenna arrays).

According to various embodiments, the RFIC 592 may be arranged in another area (e.g., the second surface opposite to the first surface) of the printed circuit board 570 spaced apart from the antenna array 580. The RFIC may be configured to be capable of processing signals in a selected frequency band transmitted/received through the antenna array 580. According to an embodiment, during transmission, the RFIC 592 may convert a baseband signal acquired from a communication processor (not illustrated) into an RF signal in a predetermined band. During reception, the RFIC 592 may convert an RF signal received through the antenna array 580 into a baseband signal and transmit the baseband signal to a communication processor.

According to another embodiment, during transmission, the RFIC 592 may up-convert an IF signal (of, e.g., about 9 GHz to about 11 GHz) acquired from an intermediate frequency integrated circuit (IFIC) into an RF signal of a selected band. During reception, the RFIC 592 may down-convert an RF signal acquired through the antenna array 580 into an IF signal and transmit the IF signal to the IFIC.

According to various embodiments, the PMIC 594 may be arranged in another partial area (e.g., the second surface) of the printed circuit board 570 spaced apart from the antenna array 580. The PMIC may receive a voltage from a main PCB (not illustrated) and may provide power for various components (e.g., the RFIC 592) on the antenna assembly.

According to various embodiments, the shield member 596 may be disposed on a portion (e.g., the second surface) of the printed circuit board 570 so as to electromagnetically shield at least one of the RFIC 592 or the PMIC 594. According to an embodiment, the shield member 596 may include a shield can.

Although not illustrated, in various embodiments, the third antenna assembly 546 may be electrically connected to another printed circuit board (e.g., the main printed circuit board) via a module interface. The module interface may include a connecting member, such as a coaxial cable connector, a board-to-board connector, an interposer, or a flexible printed circuit board (FPCB). Through the connecting member, the RFIC 592 and/or the PMIC 594 of the antenna module may be electrically connected to the printed circuit board.

Figure 6:
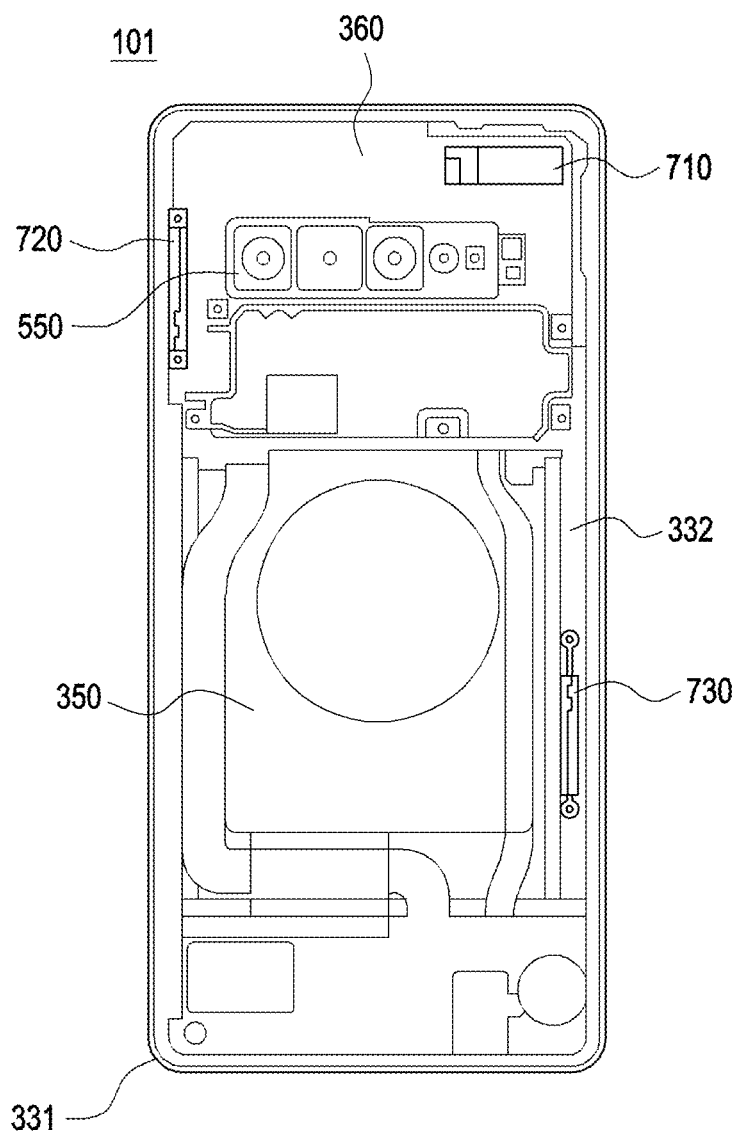
FIG. 6 illustrates a projective view of the interior of an electronic device according to various embodiments of the disclosure viewed through the rear surface of the electronic device.
Figure 7:
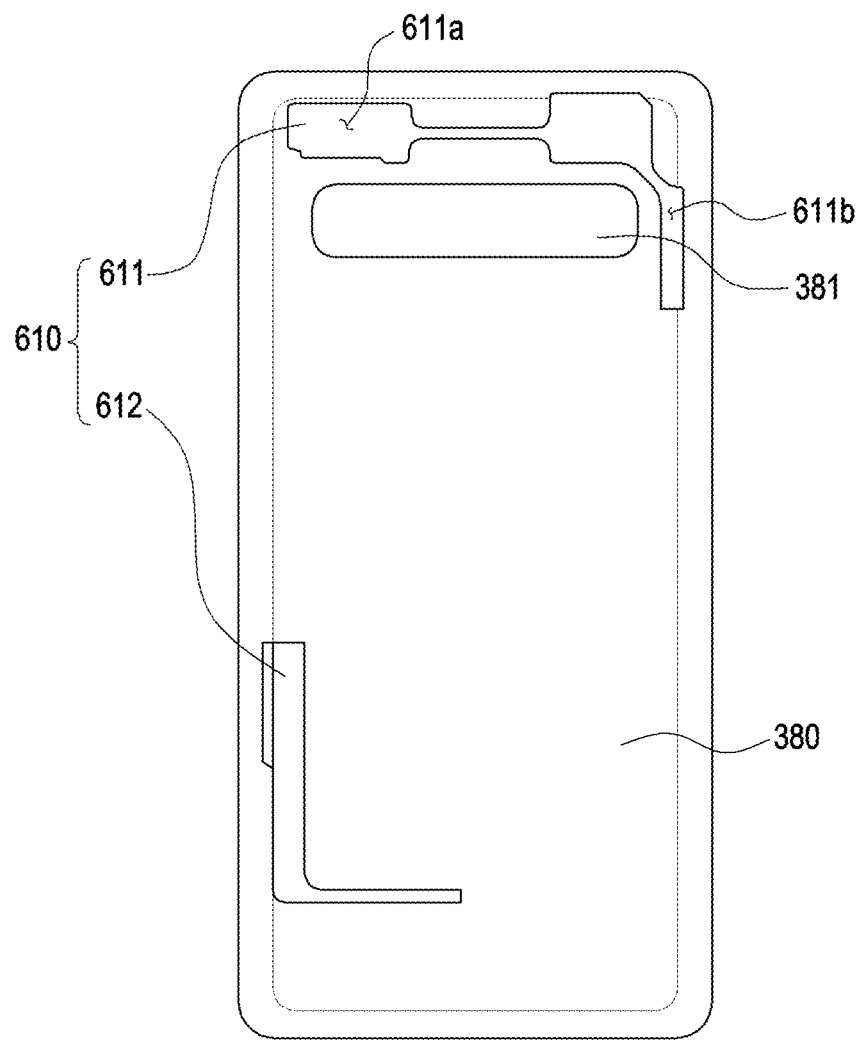
FIG. 7 illustrates a heat dissipation sheet positioned in a rear plate of an electronic device according to various embodiments of the disclosure.
Figure 8:
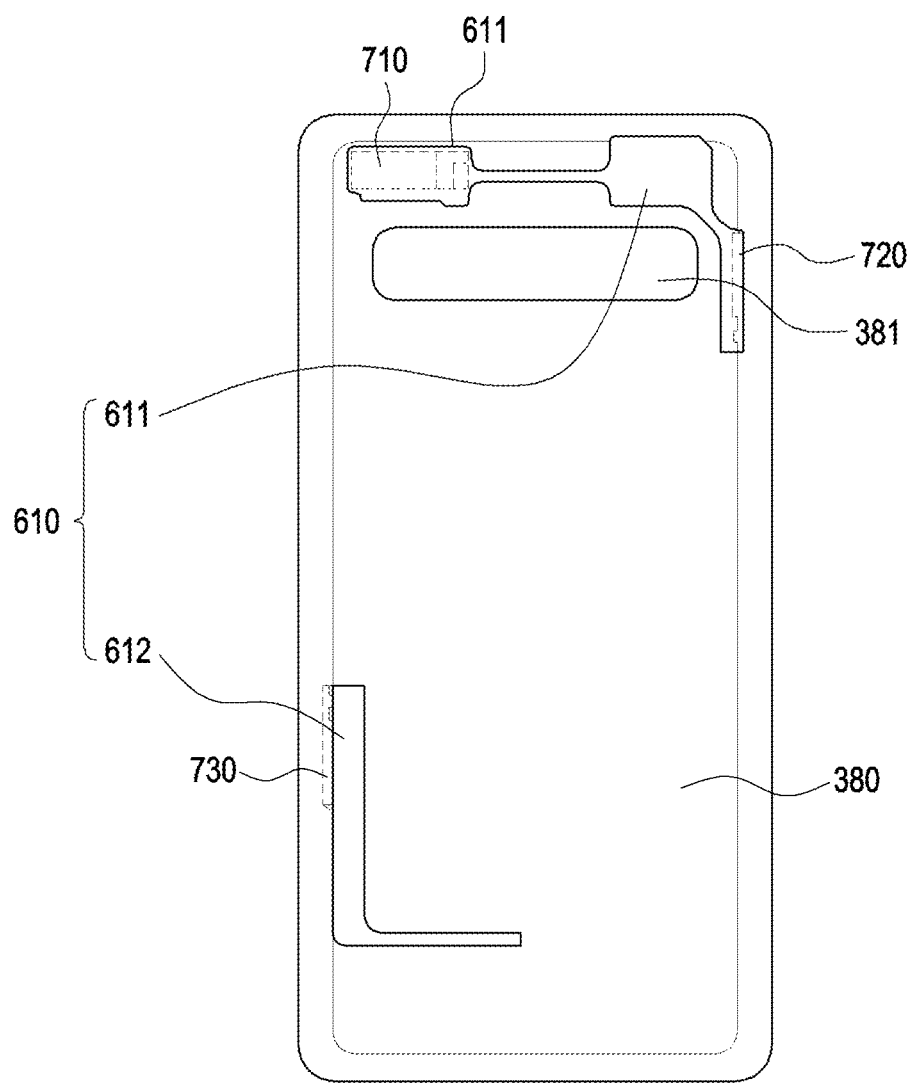
FIG. 8 illustrates an arrangement relationship between a heat dissipation sheet positioned in a rear plate of an electronic device and an antenna module positioned inside the electronic device according to various embodiments of the disclosure.

FIG. 6 illustrates a projective view of the interior of an electronic device according to various embodiments of the disclosure viewed through the rear surface of the electronic device. FIG. 7 illustrates a heat dissipation sheet positioned in a rear plate of an electronic device according to various embodiments of the disclosure. FIG. 8 illustrates an arrangement relationship between a heat dissipation sheet positioned in a rear plate of an electronic device and an antenna module positioned inside the electronic device according to various embodiments of the disclosure.

Referring to FIGS. 6 to 8, an electronic device 101 (e.g., the electronic device 101 in FIGS. 1 to 3) may include a side bezel structure 331, a first support member 332 (e.g., a bracket), a second support member 360, a battery 350, antenna modules 710, 720, and 730, a heat dissipation sheet 610, and a rear plate 380. All or some of the configurations of the side bezel structure 331, the first support member 332, the second support member 360, the battery 350, and the rear plate 380 of FIGS. 6 to 8 may be the same as those of the side bezel structure 331, the first support member 332, the second support member 360, the battery 350, and the rear plate 380.

According to various embodiments, in the internal space of the electronic device 101, the battery 350 may be disposed, and various electronic components 550 including a camera may be disposed around the battery 350. As another example, one or more antenna modules 710, 720, and 730 and heat dissipation sheets 610 may be disposed adjacent to the one or more antenna modules 710, 720, and 730 in the internal space of the electronic device 101.

According to various embodiments, each of the antenna modules 710, 720, and 730 may include a printed circuit board provided with a plurality of conductive layers, a radio frequency integrated circuit (RFIC) disposed on one surface of the printed circuit board, a power management integrated circuit (PMIC), and an antenna radiator disposed on the other surface or in the inside of the circuit board. As another example, each of the antenna modules 710, 720, and 730 may further include a connector.

According to various embodiments, a plurality of antenna modules 710, 720, and 730 may be disposed and may be positioned on the first support member 332. For example, the antenna modules 710, 720, and 730 may be spaced apart from the rear plate 380 or the heat dissipation sheet 610 adhesively disposed on the rear plate 380.

According to various embodiments, a plurality of antenna modules 710, 720, and 730 may be disposed, and may include, for example, a first antenna module 710, a second antenna module 720, and a third antenna module 730 for forming directional beams. The first antenna module 710 may be disposed such that one surface of the antenna radiator faces the rear plate 380 so as to radiate electromagnetic waves toward the rear surface of the electronic device 101. The second antenna module 720 and the third antenna module 730 may be disposed such that one surface of each of the antenna radiators thereof faces the side surface of the electronic device 101 so as to radiate electromagnetic waves toward the side surface of the electronic device 101. The second antenna module 720 and the third antenna module 730 may be disposed to be spaced apart from each other so as to radiate electromagnetic waves in different directions (e.g., orthogonal or opposite directions). The first antenna module 710 of FIGS. 6 to 8 may adapt the configuration of the first antenna assembly 561 and the second antenna assembly 563 of FIGS. 4A to 4D, and the second antenna module 720 and the third antenna module 730 of FIGS. 6 to 8 may adapt the configuration of the third antenna assembly 565 of FIGS. 4A to 4D.

According to various embodiments, the heat dissipation sheet 610 may be disposed between the first support member 332 and the rear plate 380. For example, the heat dissipation sheet 610 may be adhesively disposed on the rear plate 380. As another example, the heat dissipation sheets 610 may be disposed on the first support member 332.

According to an embodiment, a plurality of heat dissipation sheets 610 may be disposed at respective positions corresponding to the plurality of antenna modules 710, 720, and 730. For example, the plurality of heat dissipation sheets 611 and 612 may include a first heat dissipation sheet 611, at least a partial area of which is disposed to face the first antenna module 710 and the second antenna module 720, and a second heat dissipation sheet 612, at least a partial area of which is disposed to face the third antenna module 730.

According to an embodiment, the first heat dissipation sheet 611 is disposed in the upper end area of the rear plate 380, and may cover the surfaces of the first antenna module 710 and the second antenna module 720 facing the rear plate 380. For example, the first heat dissipation sheet 611 may include a first area 611a facing the first antenna module 710 and a second area 611b facing the second antenna module 720 and extending from the first area 611a. The area of the first area 611a may be larger than that of the second area 611b. As another example, the first heat dissipation sheet 611 may disposed to surround at least a portion of the periphery of an opening 381 through which a camera or the like is exposed. As another example, the first heat dissipation sheet 611 may be manufactured by bending a partial area thereof so as to have a "[" or "]" shape in general when viewed toward the inner side of the rear plate 380.

According to an embodiment, the second heat dissipation sheet 612 may be disposed to be spaced apart from the first heat dissipation sheet 611. For example, the second heat dissipation sheet 612 may be disposed in the lower middle area of the rear plate 380 and may cover the surface of the third antenna module 730 facing the rear plate 380. As another example, the second heat dissipation sheet 612 may be disposed to extend from the area in which the third antenna module 730 is disposed toward the lower end of the rear plate 380. As another example, the second heat dissipation sheet 612 may be manufactured by bending a partial area thereof so as to generally have a "|" or "]" shape when viewed toward the inner side of the rear plate 380.

According to an embodiment of the disclosure, two heat dissipation sheets 610 are provided so as to cover three antenna modules, but this disclosure is not limited thereto. It is possible to variously change the design of the heat dissipation sheets depending on the number and positions of the antenna modules. For example, a single heat dissipation sheet 610 may be provided to cover three antenna modules, three separate dissipation sheets may be provided to cover three antenna modules, or a greater number of heat dissipation sheets may be provided.

According to various embodiments, the heat dissipation sheet 610 may dissipate heat generated from the inside of the electronic device 101. For example, the electronic device 101 may include high-performance electronic components, such as an application processor (AP), a memory, and a communication chip, and when these electronic components operate, a hot spot area in which heat is concentrated may occur. The heat dissipation sheet 610 may distribute/dissipate the high-temperature heat generated in the hot spot area, thereby preventing the high-temperature heat from being transmitted to the user's hand grip.

According to various embodiments, the heat dissipation sheet 610 may include a binder resin and a ceramic filler. As another example, the heat dissipation sheet 610 may further include a high heat dissipation filler. The surface of the high heat dissipation filler may be coated with an insulating material with a low dielectric constant.

According to an embodiment, the thickness of the heat dissipation sheet 300 may be 50 μm to 1,000 μm.

According to various embodiments, the binder resin may include a rubber-based resin. For example, the binder resin may include at least one of isoprene rubber (IR), butadiene rubber (BR), styrene-butadiene rubber (SBR), ethylene propylene diene monomer (EPDM) rubber, acrylic rubber, and silicone rubber. These materials may be used alone or in combination.

According to various embodiments, the ceramic filler may include at least one of magnesium oxide, magnesium hydroxide, titanium dioxide, aluminum nitride, silicon nitride, boron nitride, hexagonal boron nitride, aluminum oxide, aluminum hydroxide, silica, zinc oxide, barium titanate, strontium titanate, beryllium oxide, silicon carbide, and manganese oxide. These materials may be used alone or in combination.

According to an embodiment, the ceramic filler may have a plate shape. The ceramic filler having a plate shape is advantageous in increasing the thermal conductivity of the heat dissipation sheet 610 in the horizontal direction. In an electronic device, such as a portable terminal, to which the heat dissipation sheet 610 is applicable, a hot spot in which heat is concentrated may occur due to a high degree of integration of components or by a component generating high-temperature heat. Since the heat dissipation sheet 610 has high thermal conductivity in the horizontal direction, it is possible to effectively alleviate the concentration of heat caused due to the hot spot.

According to an embodiment, the ceramic filler may include hexagonal boron nitride (HBN). The hexagonal boron nitride is a two-dimensional material having a crystal structure similar to that of graphite, and has high thermal conductivity, which may be advantageous for heat dissipation. When the ceramic filler including hexagonal boron nitride is mixed with graphite, heat dissipation may be improved, and the density of the heat dissipation sheet 610 may be increased. According to an embodiment, the grain size of the ceramic filler may be 1 μm to 200 μm. When the grain size of the ceramic filler is excessively small, it is difficult to obtain a desired heat dissipation performance, and when the grain size of the ceramic filler is excessively large, it is difficult to shape a sheet.

According to an embodiment, the ceramic filler may be used by mixing those having different grain sizes. The mixture of ceramic fillers having different grain sizes is capable of increasing the filler density of the heat dissipation sheet 610, thereby improving heat dissipation performance. For example, the ceramic filler may include a first ceramic filler having a grain size of 20 μm or more and 40 μm or less, a second ceramic filler having a grain size of 10 μm or more and less than 20 and a third ceramic filler having a grain size of 1 μm or more and less than 10 In the total ceramic filler, the content of the first ceramic filler may be 45 wt % to 65 wt %, the content of the second ceramic filler may be 20 wt % to 40 wt %, and the third ceramic filler may be 5 wt % to 25 wt %.

According to various embodiments, the high-heat dissipation filler may include a core having high thermal conductivity and an insulating coating layer surrounding the core. The high heat dissipation filler may have a plate shape, and the high heat dissipation filler having a plate shape is advantageous in increasing the thermal conductivity of the heat dissipation sheet in the horizontal direction.

According to an embodiment, the grain size of the high heat dissipation filler may be 10 μm to 200 μm. When the grain size of the high heat dissipation filler is excessively small, it is difficult to obtain a desired heat dissipation performance, and when the grain size of the ceramic filler is excessively large, it is difficult to form a sheet shape. Preferably, the high heat dissipation filler may include graphite with high anisotropy.

According to an embodiment, the core may include a material having higher thermal conductivity than that of the ceramic filler. For example, the core may include a carbon-based material having high thermal conductivity, such as carbon black, graphite, graphene, or carbon nanotubes. As another example, the core may further include metal nanoparticles in addition to the carbon-based material. The metal nanoparticles may be bonded to the surface of the core. For example, the metal nanoparticles may include at least one of nickel, copper, chromium, manganese, iron, cobalt, titanium, strontium, platinum, gold, and magnesium. For example, it is possible to provide metal nanoparticles on the surface of the carbon-based material core by performing deposition or crystallizing a metal at a high density on the surface of the carbon-based material core. As another example, dopamine may be bound to the surface of the core.

According to one embodiment, the thickness of the insulating coating layer may be 50 nm to 1 μm. When the thickness of the insulating coating layer is too small, the dielectric constant of the heat dissipation sheet 610 may increase, which may cause reduction of the efficiency of communication wireless signals, and when the thickness is excessively large, heat dissipation performance may be deteriorated. For example, an insulating coating layer with a low dielectric constant applied to the surface of the high heat dissipation filler may include at least one of silicon oxide, silicon nitride, and silicon carbide. As another example, the insulating coating layer with a low dielectric constant may include silicon oxide.

According to an embodiment, the insulating coating layer including the silicon oxide may be formed by mixing the core particles, a silica precursor, water, and ethanol, and performing a chain hydrolysis/condensation reaction of the silica precursor. For example, tetraethyl orthosilicate (TEOS) may be used as the silica precursor. The material having high thermal conductivity of the core also has high electrical conductivity. Therefore, when the core material is used alone, the heat dissipation performance of the heat dissipation sheet 610 may be improved, but the efficiency of communication wireless signals may be reduced. However, according to an embodiment of the disclosure, by using a high heat dissipation filler coated with an insulating coating layer with a low dielectric constant on the core, it is possible to maintain the low dielectric constant while improving the heat dissipation performance of the heat dissipation sheet. Accordingly, it is possible to reduce the disturbance, weakening, or interference of communication wireless signals. In addition, it is easy to form a sheet due to high dispersibility in a rubber resin compared to graphite particles not subjected to insulating coating, and it is possible to form a heat dissipation sheet with a high content of heat dissipation filler.

According to various embodiments, the total content of the ceramic filler and the high heat dissipation filler in the heat dissipation sheet 610 may be 80 wt % to 98 wt %. According to an embodiment, the content of the ceramic filler may be 60 wt % to 80 wt %, and the content of the high heat dissipation filler may be 15 wt % to 35 wt %. For example, the content of the ceramic filler may be 65 wt % to 75 wt %, and the content of the high heat dissipation filler may be 20 wt % to 30 wt %. When the content of the ceramic filler is excessive, heat dissipation performance may be deteriorated, and when the content of the high heat dissipation filler is excessive, the efficiency of communication wireless signals may decrease due to an increase in dielectric constant.

Figure 9:
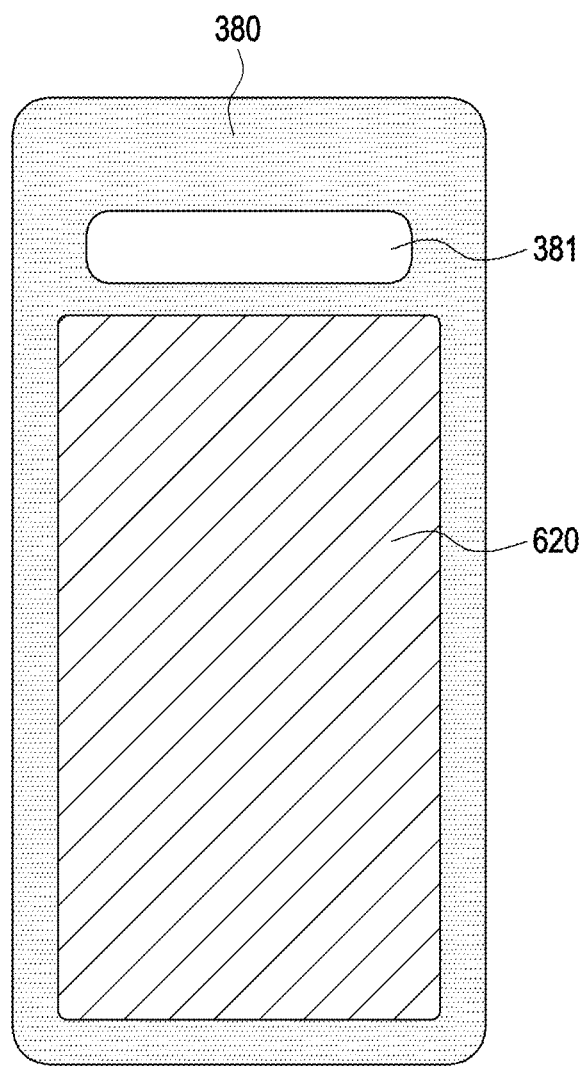
FIG. 9 illustrates a cross-sectional view schematically illustrating a heat dissipation sheet disposed inside an electronic device according to another embodiment of the disclosure.
Figure 10:
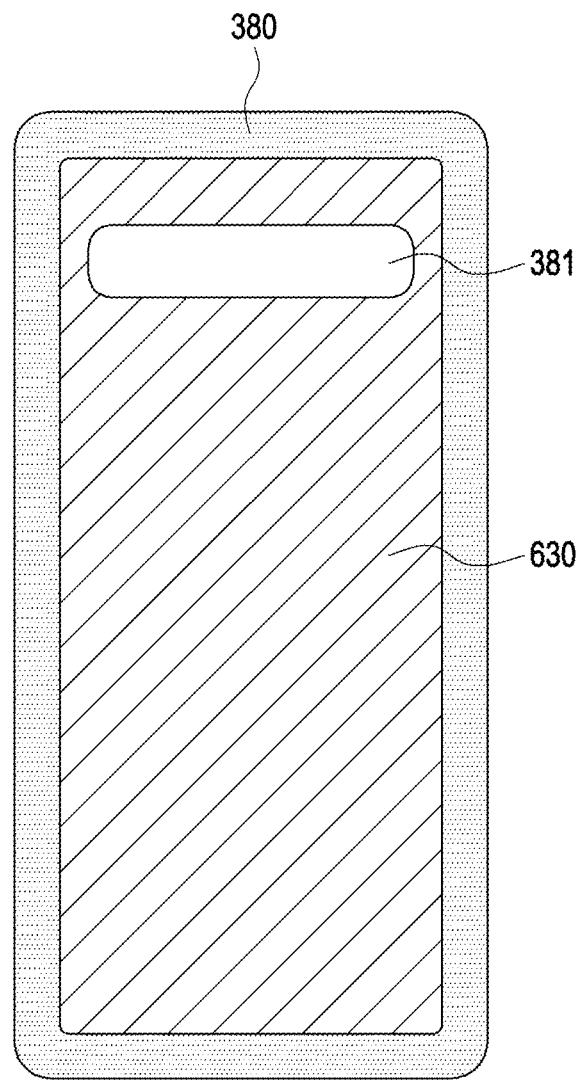
FIG. 10 illustrates a cross-sectional view schematically illustrating a heat dissipation sheet disposed inside an electronic device according to still another embodiment of the disclosure.

FIG. 9 illustrates a cross-sectional view schematically illustrating a heat dissipation sheet disposed inside an electronic device according to another embodiment of the disclosure. FIG. 10 illustrates a cross-sectional view schematically illustrating a heat dissipation sheet disposed inside an electronic device according to still another embodiment of the disclosure.

According to various embodiments, an electronic device (e.g., the electronic device 101 in FIGS. 1 and 3) may include a front plate (e.g., the front plate 320 in FIG. 2), a rear plate 380, and an antenna module (e.g., the antenna modules 710, 720, and 730 in FIG. 8), and a heat dissipation sheet disposed between the front plate 320 and the rear plate 380. FIGS. 8 and 9 show arrangement relationships between the rear plate 380 and the heat dissipation sheets 620 and 630.

Referring to FIGS. 9 and 10, the heat dissipation sheets 620 and 630 may be disposed on the rear plate 380. The heat dissipation sheets 620 and 630 are able to dissipate heat generated from the inside of the electronic device 101. For example, the electronic device 101 may include high-performance electronic components, such as an application processor (AP), a memory, and a communication chip, and when these electronic components operate, a hot spot area in which heat is concentrated may occur. The heat dissipation sheet 620, 630 may distribute/dissipate the high-temperature heat generated in the hot spot area, thereby preventing the high-temperature heat from being transmitted to the user's hand grip.

According to various embodiments, the heat dissipation sheets 620 and 630 may cover the entire inner surface of the rear plate 380. For example, the rear plate 380 may include an opening 381 for exposing a camera or the like, and the heat dissipation sheets 620 and 630 may be disposed in a peripheral area excluding the opening 381.

Referring to FIG. 9, the heat dissipation sheet 620 may generally have a rectangular shape, and may be made of a single sheet paper spaced apart from the opening 381. The heat dissipation sheet 620 is capable of dissipating high-temperature heat generated in the hot spot area through heat exchange with the entire surface of the rear plate 380.

Referring to FIG. 10, the heat dissipation sheet 630 may generally have a rectangular shape, and may be formed of a single sheet in which an area corresponding to the opening 381 is punched out and opened. The heat dissipation sheet 630 may have a shape surrounding the opening 381. The heat dissipation sheet 630 is capable of dissipating high-temperature heat generated in the hot spot area through heat exchange with the entire surface of the rear plate 380.

Figure 11:
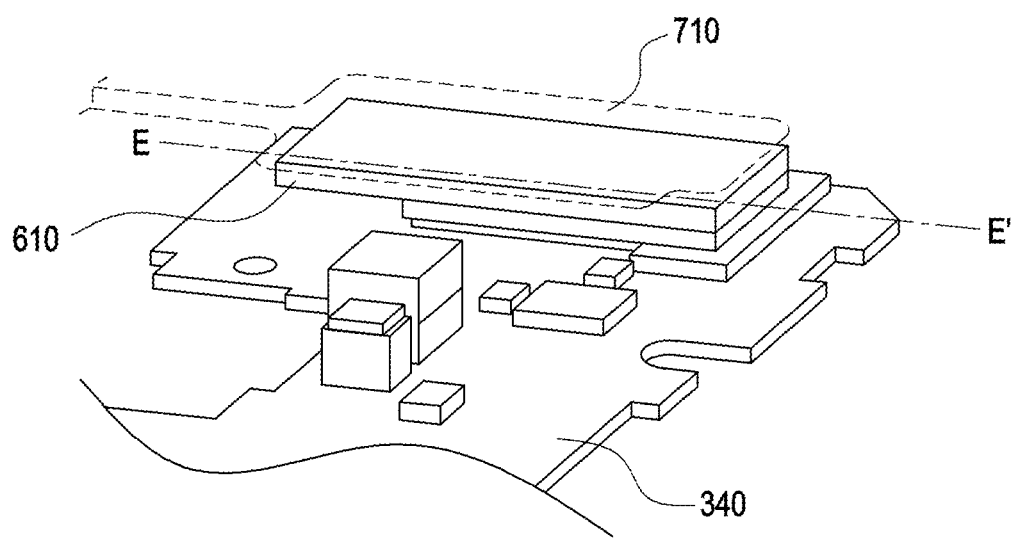
FIG. 11 illustrates a perspective view illustrating an arrangement relationship between an antenna module and a heat dissipation sheet according to various embodiments of the disclosure.
Figure 12:
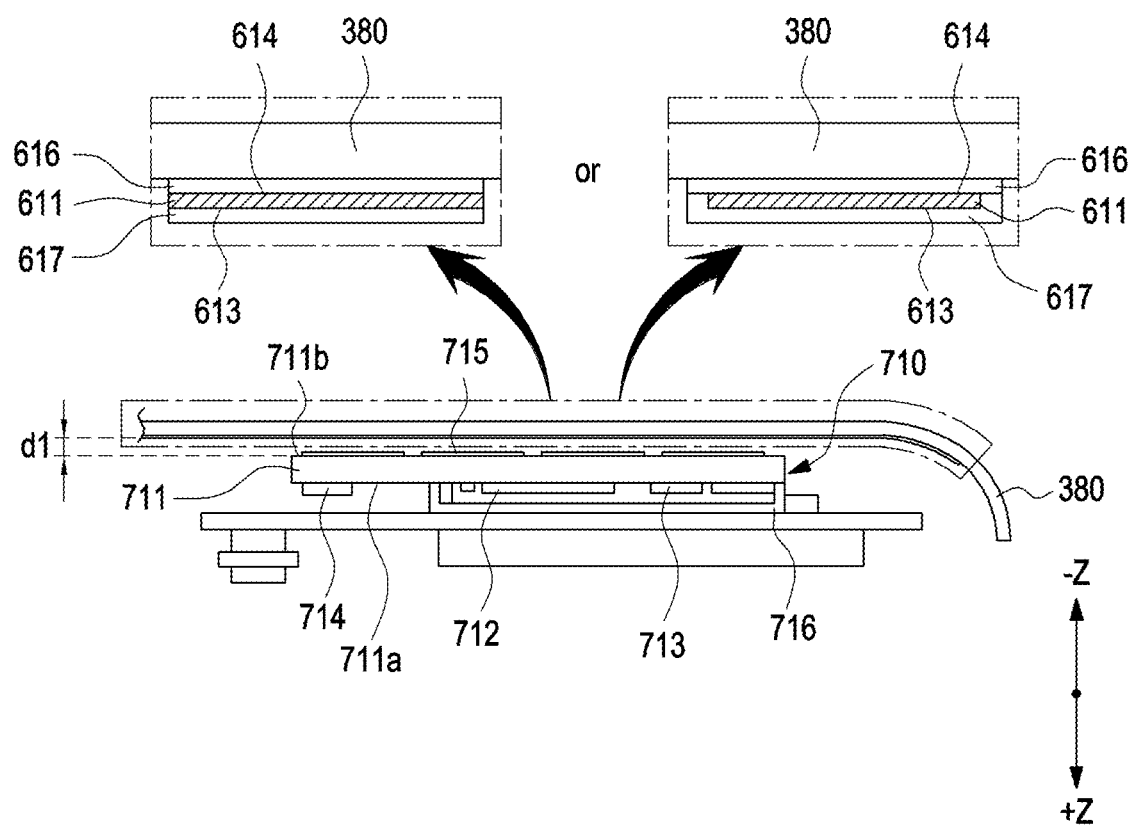
FIG. 12 illustrates a cross-sectional view of a stacked structure of an antenna module and a heat dissipation sheet, taken along line E-E' in FIG. 11.

FIG. 11 illustrates a perspective view illustrating an arrangement relationship between an antenna module and a heat dissipation sheet according to various embodiments of the disclosure. FIG. 12 illustrates a cross-sectional view of a stacked structure of an antenna module and a heat dissipation sheet, taken along line E-E' in FIG. 11.

According to various embodiments, an electronic device (e.g., the electronic device 101 in FIGS. 1 and 3) may include a front plate (e.g., the front plate 320 in FIG. 2), a rear plate 380, an antenna module 710, 720, or 730, and a first heat dissipation sheet 611 disposed between the front plate 320 and the rear plate 380. FIGS. 11 and 12 illustrate arrangement relationships between the rear plate 380 and the first heat dissipation sheet 611.

The rear plate 380 of FIGS. 11 and 12 may adapt the configuration of the rear plate 380 of FIG. 2, and the first antenna module 710 of FIGS. 11 and 12 may adapt the configurations of the antenna assemblies 461 and 463 of FIGS. 3 to 5 and the configuration of the first antenna module 710 of FIG. 8. The configuration of the first heat dissipation sheet 611 of FIGS. 11 and 12 may adapt the configuration of the first area 611a of the first heat dissipation sheet 611 of FIGS. 6 to 8. In FIGS. 11 and 12, the second support member 360 of FIG. 2 is omitted for convenience of description. The second support member 360 has a hole located in an area that substantially faces the first antenna module 710 and the first heat dissipation sheet 611. Thus, the first antenna module 710 and the first heat dissipation sheet 611 are capable of directly facing each other.

According to various embodiments, the first antenna module 710 may include a printed circuit board 711, and the printed circuit board 711 may include a first surface 711a facing a first direction (+Z) and a second surface 711b facing in a direction opposite to the first surface 711a (e.g., a second direction (−Z)). For example, with reference to a plurality of conductive layers constituting the printed circuit board 711, an RFIC 712, a PMIC 713, a connector 714, and various electronic components may be disposed on the first surface 711a of the first antenna module 710. An antenna radiator 715 may be disposed on or inside the second surface 711b. The RFIC 712, the PMIC 713, and/or the antenna radiator 715 may be hot spot areas that generate high-temperature heat.

According to various embodiments, the antenna radiator 715 may be an antenna array (e.g., the antenna array 580 in FIG. 5) including a plurality of conductive plates or radiation conductors, and may include antenna types having various structures. For example, the antennas may be at least one of a patch type antenna or a dipole type antenna.

According to various embodiments, the RFIC 712 may be electrically connected to the antenna radiator, and may receive a communication signal having a designated frequency or transmit a received communication signal through a wireless transceiver. For example, the RFIC 712 may perform wireless communication using the plurality of conductive plates or radiation conductors while being controlled by a processor (e.g., the processor 120 in FIGS. 1 and 3). In another embodiment, the RFIC 712 may receive a control signal and power from the processor 120 and the power management module (e.g., the power management module 188 in FIG. 1), and may process a communication signal received from the outside or a communication signal to be transmitted to the outside. For example, the RFIC 712 may include a switch circuit for separating transmission/reception signals as well as various amplifiers and filter circuits for improving the quality of transmission/reception signals.

According to an embodiment, when the multiple conductive plates or radiation conductors form an antenna array, the RFIC 712 may include a phase shifter, a transmitter (TX), a receiver (RX), and a voltage gain amplifier connected to respective conductive plates or radiation conductors, thereby controlling the direction in which the communication device (e.g., the electronic device 101) is oriented. As another example, the RFIC 712 may be useful for securing an optimal communication environment or a good communication environment in a communication method with strong straightness, such as millimeter wave communication (e.g., wireless communication using a frequency band of 6 GHz or more and 300 GHz or less), through phase difference feeding. According to an embodiment, a shielding member 716 may be disposed around the RFIC 712 so as to shield the RFIC 712 and the PMIC 713.

According to various embodiments, the first antenna module 710 may include a connector 714, and the connector 714 may be electrically connected to an external board (e.g., a main circuit board) via a bridge circuit board. For example, each of opposite ends of the bridge circuit board may include a connector (e.g., a coaxial cable connector or a B-to-B (board to board)), and may connect a signal of the RFIC 712 to the main circuit board (e.g., the printed circuit board 340 in FIG. 2). According to an embodiment, the bridge circuit board may include a flexible circuit board. As another example, the bridge circuit board may include a coaxial cable using a coaxial cable connector, and the coaxial cable may be used to transmit transmission and reception IF signals or RF signals. As another example, power or other control signals may be transmitted via the B-to-B connector.

According to various embodiments, the first heat dissipation sheet 611 may be disposed to be spaced apart from one surface of the first antenna module 710 facing the rear plate 380 by a predetermined distance dl. The predetermined distance dl may vary depending on the shape, such as thickness and size, and the position of the antenna module.

According to various embodiments, the first heat dissipation sheet 611 may include a first surface 613 facing the first direction (+Z) and a second surface 614 facing the second direction (—Z), which is opposite to the first direction (+Z). An adhesive member 616 may be disposed between the second surface 614 of the first heat dissipation sheet 611 and the rear plate 380. For example, the adhesive member 616 may have an area corresponding to that of the first heat dissipation sheet 611 so as to attach the first heat dissipation sheet 611 to the rear plate 380. As another example, a coating member 617 may be disposed between the first surface 613 of the first heat dissipation sheet 611 and the first antenna module 710. The coating member 617 may be disposed to cover the first surface 613 of the first heat dissipation sheet 611.

According to an embodiment, the adhesive member 616, the first heat dissipation sheet 611, and the coating member 617 may be sequentially stacked in the first direction (+Z) with reference to the rear plate 380. Some areas of the adhesive member 616, the first heat dissipation sheet 611, and the coating member 617 may be designed to have various shapes and areas. For example, when viewed from the rear plate 380, an adhesive member 616 having an area A may be disposed on one area of the rear plate 380, and a first heat dissipation sheet 611 and a coating member 617 having an area corresponding to the area A of the adhesive member 616 may be stacked thereon. As another example, when viewed from the rear plate 380, an adhesive member 616 having an area A may be disposed on one area of the rear plate 380, and a first heat dissipation sheet 611 having an area B smaller than the area A may be disposed thereon. The coating member 617 may be disposed on the first heat dissipation sheet 611 with the area A to surround the first surface 613 and side areas of the first heat dissipation sheet 611. As another example, when viewed from the rear plate 380, an adhesive member 616 having an area A may be disposed on one area of the rear plate 380, and a first heat dissipation sheet 611 having an area corresponding to the area A of the adhesive member 616 may be stacked thereon. The coating member 617 may be disposed on the first heat dissipation sheet 611 with an area C larger than the area A so as to surround the first heat dissipation sheet 611 and the adhesive member 616 such that the first heat dissipation sheet 611 and the adhesive member 616 are not exposed.

Figure 13A:
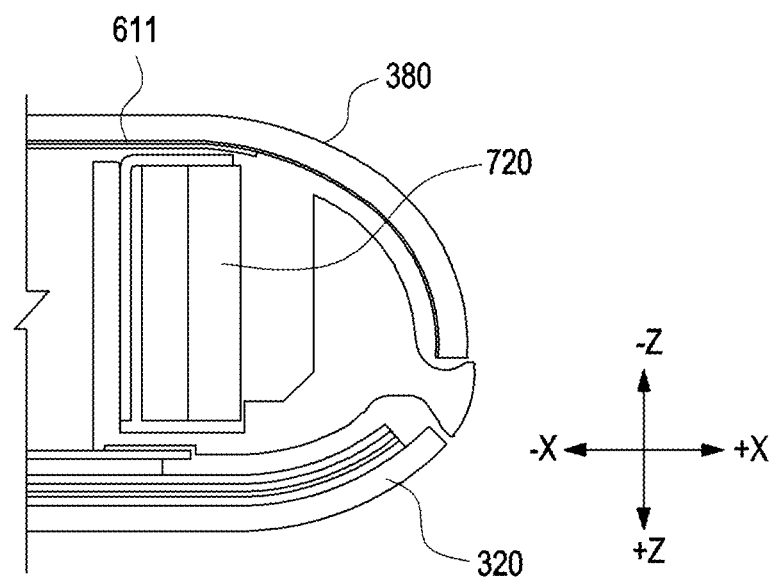
FIG. 13A illustrates a cross-sectional view of an electronic device illustrating the second antenna module of FIG. 8 and a heat dissipation sheet adjacent thereto.
Figure 13B:
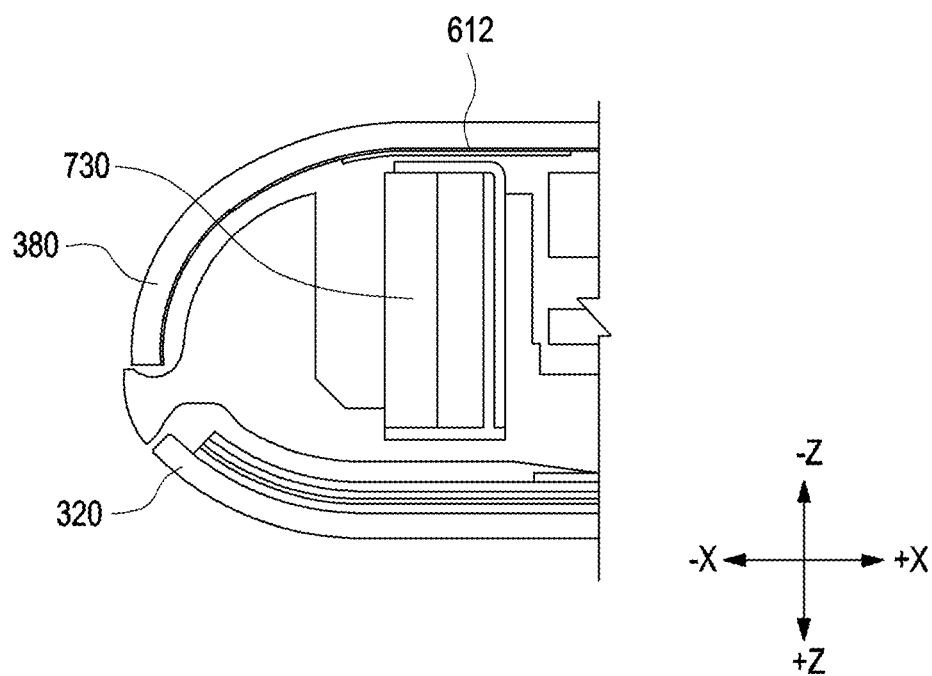
FIG. 13B illustrates a cross-sectional view of an electronic device illustrating the third antenna module of FIG. 8 and a heat dissipation sheet adjacent thereto.

FIG. 13A illustrates a cross-sectional view of an electronic device illustrating the second antenna module of FIG. 8 and a heat dissipation sheet adjacent thereto. FIG. 13B illustrates a cross-sectional view of an electronic device illustrating the third antenna module of FIG. 8 and a heat dissipation sheet adjacent thereto.

Referring to FIGS. 13A and 13B, an electronic device (e.g., the electronic device 101 in FIGS. 1 and 3) may include a front plate 320, a rear plate 380, a second antenna module 720, a third antenna module 730, and heat dissipation sheets 611 and 612 disposed between the front plate 320 and the rear plate 380.

The rear plate 380 of FIGS. 13A and 13B may adapt the configuration of the rear plate 380 of FIG. 2, and the second antenna module 720 and the third antenna module 730 of FIGS. 13A and 13B may adapt the configurations of the antenna assemblies 461, 463, and 465 of FIGS. 3 to 4C and the configurations of the second antenna module 720 and the third antenna module 730 of FIG. 8. The heat dissipation sheet 610 of FIGS. 13A and 13B may adapt the configurations of the second area 611b of the first heat dissipation sheet 611 and the second heat dissipation sheet 612 of FIGS. 6 to 8.

Referring to FIG. 13A, the second antenna module 720 may include an antenna radiator disposed to face a side surface (e.g., third direction (+X)) of the electronic device 101 in order to provide a directional beam toward the side surface. One area of the first heat dissipation sheet 611 may be disposed to be separated from the surface of the second antenna module 720 facing the rear plate 380. The separated space may be filled with air, and may help heat generated in the hot spot area to be evenly distributed and moved in the first heat dissipation sheet 611.

Referring to FIG. 13B, the third antenna module 730 may include an antenna radiator disposed to face a side surface (e.g., fourth direction (−X)) of the electronic device 101 in order to provide a directional beam toward the side surface. One area of the second heat dissipation sheet 612 may be disposed to be separated from the surface of the third antenna module 730 facing the rear plate 380. The separated space may be filled with air, and may help heat generated in the hot spot area to be evenly distributed and moved in the second heat dissipation sheet 612.

Hereinafter, a method for manufacturing the heat dissipation sheet disclosed in FIGS. 6 to 13B will be described.

Figure 14:
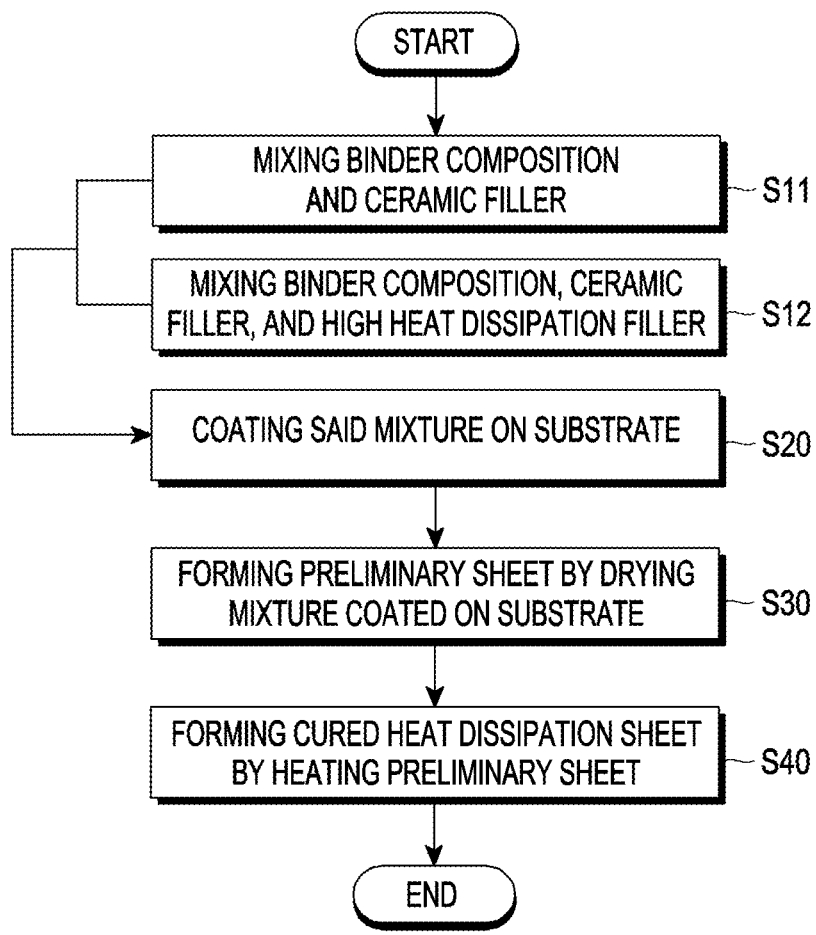
FIG. 14 illustrates a flowchart illustrating a process of manufacturing a heat dissipation sheet according to various embodiments of the disclosure.

FIG. 14 illustrates a flowchart illustrating a process of manufacturing a heat dissipation sheet according to various embodiments of the disclosure.

A process of manufacturing a heat dissipation sheet according to an embodiment of the disclosure may include a step of mixing a binder composition and a ceramic filler (S11), a step of coating the mixture on a substrate (S20), a step of forming a preliminary sheet by drying the mixture coated on the substrate (S30), and a step of forming a cured heat dissipation sheet by heating the preliminary sheet (S40).

In the process of manufacturing the heat dissipation sheet according to another embodiment of the disclosure, a high heat dissipation filler may be further included in the step of forming the mixture. Accordingly, the process may include a step of mixing a binder composition, a ceramic filler, and a high heat dissipation filler (S12), a step of coating the mixture on a substrate (S20), a step of forming a preliminary sheet by drying the mixture coated on the substrate (S30), and a step of forming a cured heat dissipation sheet by heating the preliminary sheet (S40).

According to various embodiments, in the step of mixing the binder composition and the ceramic filler (S11) or the step of mixing the binder composition, the ceramic filler, and the high heat dissipation filler (S12), the binder composition may include a binder resin, a curing agent, and a solvent. The binder resin may include a rubber-based resin.

According to an embodiment, as the curing agent, at least one of an isocyanate-based curing agent, an amine-based curing agent, and an epoxy-based curing agent may be used.

As another example, the curing agent may be an isocyanate-based curing agent. According to an embodiment, the content of the curing agent may be 1 to 5 weight parts with respect to 100 weight parts of the binder resin. When the content of the curing agent is too small, the shape stability and heat resistance of the heat dissipation sheet may be deteriorated, and when the content of the curing agent is excessive, hardness may be excessively increased.

According to an embodiment, the solvent may be a non-polar solvent, such as toluene, xylene, methyl ethyl ketone, or the like. For example, the content of the solvent may be 100 to 1,000 weight parts with respect to 100 weight parts of the binder resin, and may be appropriately adjusted according to the viscosity or the like of the composition to be obtained. Since the ceramic filler and the high heat dissipation filler are substantially the same as those already described, a detailed description thereof will be omitted.

According to an embodiment, a 3-roll-mill and/or a PL mixer may be used to evenly disperse the ceramic filler and the high heat dissipation filler in the binder composition and to obtain an appropriate viscosity.

After the step of mixing, the mixture may be coated on a substrate to form a sheet shape (S20). The method of coating the mixture is not particularly limited, and, for example, knife coating using a comma coater may be used.

Thereafter, the mixture coated onto the substrate in a sheet shape may be dried to remove the solvent. For example, the mixture may be dried at 70° C. to 95° C. to remove the solvent to form a preliminary sheet (S30).

Thereafter, a cured heat dissipation sheet may be formed by heating the preliminary sheet (S40). For example, the heating of the preliminary sheet may be performed at 120° C. to 170° C. so that a curing reaction by the curing agent can proceed.

According to an embodiment, the heat dissipation sheet may be formed by stacking, for example, two or more preliminary sheets and pressing/heating the preliminary sheets so that the heat dissipation sheet can have a desired thickness. In addition, through the pressing, it is possible to improve the heat dissipation performance in the horizontal direction since the fillers having anisotropy in the heat dissipation sheet are oriented in the horizontal direction. Hereinafter, the manufacturing method and effect of this disclosure will be described through specific synthesis examples, examples, and tests.

Figure 15:
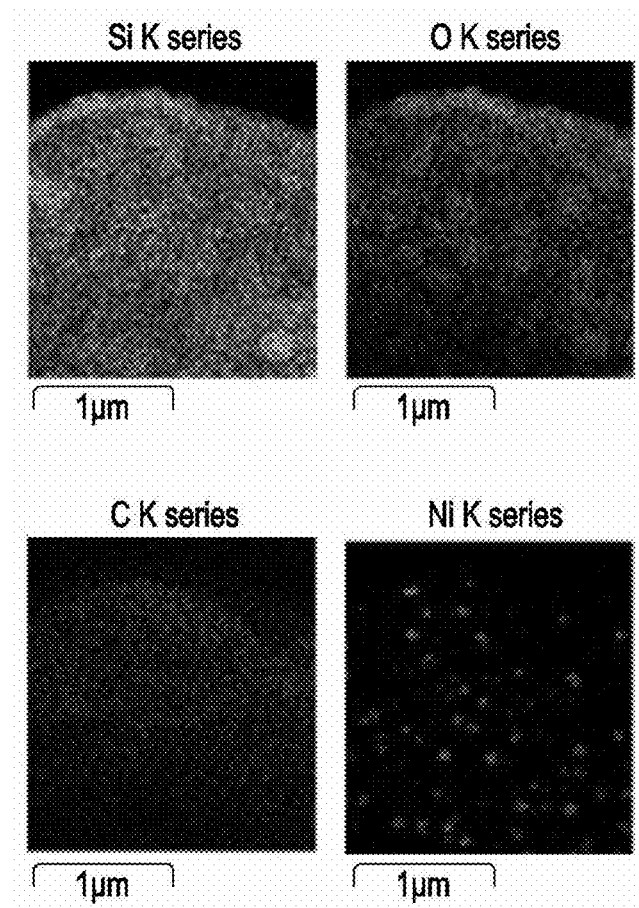
FIG. 15 illustrates a view illustrating mapping images of respective elements of a heat dissipation filler of a heat dissipation sheet according to various embodiments of the disclosure, obtained through energy dispersive x-ray spectroscopy (EDS)

FIG. 15 illustrates a view illustrating mapping images of respective elements of a heat dissipation filler of a heat dissipation sheet according to various embodiments of the disclosure, obtained through energy dispersive x-ray spectroscopy (EDS).

Figure 16:
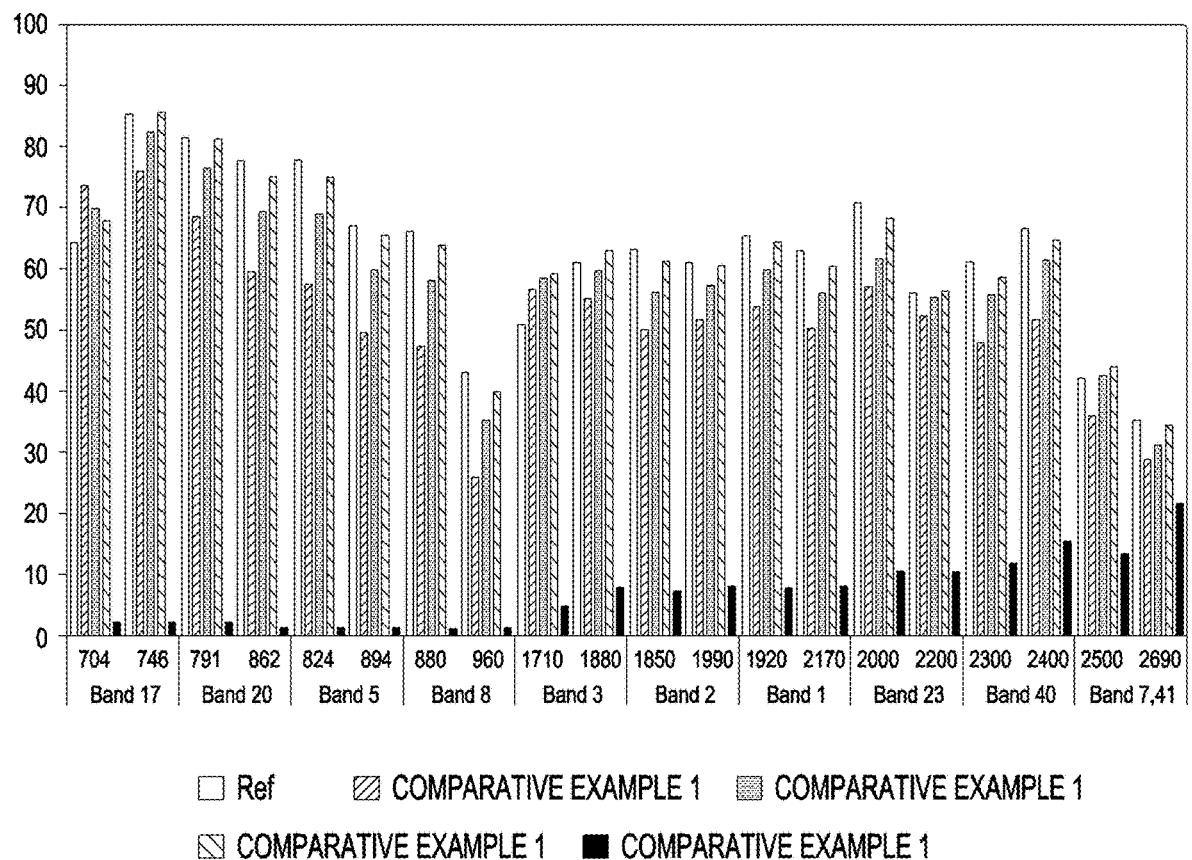
FIG. 16 illustrates a graph illustrating antenna efficiency when heat dissipation sheets are applied through various embodiments and comparative examples of the disclosure.

FIG. 16 illustrates a graph illustrating antenna efficiency when heat dissipation sheets are applied through various embodiments and comparative examples of the disclosure.

According to various embodiments of the disclosure, a heat dissipation sheet may include a binder resin and a ceramic filler. As another example, the heat dissipation sheet may further include a high heat dissipation filler. The surface of the high heat dissipation filler may be coated with an insulating material with a low dielectric constant. The high heat dissipation filler coated with an insulating coating layer with a low dielectric constant may be prepared through the following synthesis example.

According to the synthesis example, 14 g of TEOS, 2 g of plate-shaped graphite with an average grain diameter of 75 μm, 100 g of a mixture of ionized water and ethanol (deionized water:ethanol=1:10) and ammonia were mixed (so that the pH of the mixture becomes 8 to 9) and stirred at room temperature for 4 hours. Next, the reaction was carried out at room temperature for 24 hours, washing was performed using deionized water, and particles were separated using a filter. Next, a heat dissipation filler was obtained by drying the particles in a vacuum oven at 60° C. for 6 hours. The graphite having nickel nanoparticles bonded to the surface thereof was used.

Referring to FIG. 15, it can be seen that a silicon oxide (Si+0) coating layer is formed on the surface of a carbon (C) core in which nickel (Ni) is dispersed.

According to an embodiment, it is possible to manufacture a heat dissipation sheet using the high heat dissipation filler coated with the insulating coating layer with a low dielectric constant (e.g., the synthetic example). Hereinafter, the manufacturing processes of Example 1 and Comparative Examples 1-3 will be described.

Example 1

The heat dissipation filler, hexagonal boron nitride particles, and binder composition obtained in Synthesis Example 1 were mixed and dispersed in a weight ratio of 25:70:5 (using a 3-roll-mill and a PL mixer), and formed into a sheet shape using a comma coater, and then dried in an oven at 80° C. for 10 minutes, thereby forming a preliminary sheet. Two preliminary sheets were stacked and pressed at 150° C. for 30 minutes using a hot press. Thereby a heat dissipation sheet having a thickness of about 130 μm was obtained. The dielectric constant of the heat dissipation sheet was measured as 4.6.

In the composition, hexagonal boron nitride particles having diameters of 32 μm, 16 and 4 μm were mixed in a weight ratio of 4:2:1, and the binder composition included 13 wt % of styrene-butadiene rubber, 0.2 wt % of an isocyanate-based curing agent and 86.8 wt % of toluene.

Comparative Example 1

Plate-shaped graphite of 75 the hexagonal boron nitride particles of Example 1, and the binder composition of Example 1 were mixed and dispersed in a weight ratio of 25:60:15 (using a 3-roll-mill and a PL mixer), formed into a sheet shape using a comma coater, and then dried in an oven at 80° C. for 10 minutes. Thereby, a preliminary sheet was formed. Two preliminary sheets were stacked and pressed at 150° C. for 30 minutes using a hot press. Thereby, a heat dissipation sheet having a thickness of about 100 μm was obtained. The dielectric constant of the heat dissipation sheet was measured as 11.6.

Comparative Example 2

Plate-shaped graphite of 75 the hexagonal boron nitride particles of Example 1, and the binder composition of Example 1 were mixed and dispersed in a weight ratio of 25:70:5 (using a 3-roll-mill and a PL mixer), formed into a sheet shape using a comma coater, and then dried in an oven at 80° C. for 10 minutes. Thereby, a preliminary sheet was formed. Two preliminary sheets were stacked and pressed at 150° C. for 30 minutes using a hot press. Thereby, a heat dissipation sheet having a thickness of about 125 μm was obtained. The dielectric constant of the heat dissipation sheet was measured as 11.1.

Comparative Example 3

Plate-shaped graphite of 75 μm and the binder composition of Example 1 were mixed and dispersed in a weight ratio of 85:15 (using a 3-roll-mill and a PL mixer), formed into a sheet shape using a comma coater, and then dried in an oven at 80° C. for 10 minutes. Thereby, a preliminary sheet was formed. Two preliminary sheets were stacked and pressed at 150° C. for 30 minutes using a hot press. Thereby a heat dissipation sheet having a thickness of about 110 μm was obtained. The dielectric constant of the heat dissipation sheet was measured as 43.1.

Referring to FIG. 15, it is possible to confirm the antenna efficiency obtained when the heat dissipation sheets of Example 1 and comparative examples of this disclosure were applied. Tests were performed for LTE frequencies and WiFi frequencies. Ref in FIG. 15 indicates values measured without a heat dissipation sheet, Y-axis represents efficiency (%), and X-axis represents frequency. Consequently, when a high heat dissipation filler (e.g., graphite) subjected to insulating coating was used, it can be confirmed that antenna efficiency is remarkably improved.

The following Table 1 shows a difference in surface temperature compared to power consumption when a heat dissipation sheet of this disclosure was applied.

TABLE 1

| Mode | Consumption Power | Surface temperature (°C) | |
| --- | --- | --- | --- |
| | | Front surface | Rear surface |
| 1 Designed configuration including heat dissipation sheet | 3.73 W | 42.6 | 41.3 |
| 2 Configuration without heat dissipation sheet | 3.73 W | 42.6 | 42.3 (1.0↑) |

In Table 1, the configuration in which a heat dissipation sheet of this disclosure was disposed on a rear plate and the configuration in which a heat dissipation sheet was generally absent were compared. The configurations were compared in the case where the power consumption was about 3.73 W, about 0.78 W was applied to the RFIC of the antenna module, and about 1.17 W was applied to the PMIC. It can be confirmed that in the configuration of the heat dissipation sheet according to an embodiment of the disclosure, since the surface temperature generated on the rear plate is reduced by about 1° C., the surface temperature of the area in which an antenna module is disposed is improved.

According to various embodiments of the disclosure, an electronic device may include: a front plate (e.g., the front plate 320 in FIG. 2) oriented in a first direction; a rear plate (e.g., the rear plate 380 in FIG. 2) oriented in a second direction opposite to the first direction; at least one antenna module (e.g., the antenna module 390 in FIG. 2) disposed between the front plate and the rear plate; and at least one heat dissipation sheet (e.g., the heat dissipation sheet 610 in FIG. 6) spaced apart from the at least one antenna module and adhesively disposed on the rear plate. The at least one heat dissipation sheet may include a ceramic filler and a binder resin mixed with the ceramic filler.

According to various embodiments, the heat dissipation sheet may further include a high heat dissipation filler including a core including a material having higher thermal conductivity than the ceramic filler and an insulating coating layer surrounding at least a portion of a surface of the core.

According to various embodiments, the ceramic filler may include at least one selected from a group consisting of magnesium oxide, magnesium hydroxide, titanium dioxide, aluminum nitride, silicon nitride, boron nitride, hexagonal boron nitride, aluminum oxide, aluminum hydroxide, silica, zinc oxide, barium titanate, strontium titanate, beryllium oxide, silicon carbide, and manganese oxide.

According to various embodiments, the ceramic filler may include hexagonal boron nitride.

According to various embodiments, the ceramic filler may include a first ceramic filler having a grain size of 20 μm or more and 40 μm or less, a second ceramic filler having a grain size of 10 μm or more and less than 20 and a third ceramic filler having a grain size of 1 μm or more and less than 10 μm.

According to various embodiments, the content of the first ceramic filler may be 45 wt % to 65 wt % of the total weight of the ceramic filler, the content of the second ceramic filler may be 20 wt % to 40 wt % of the total weight of the ceramic filler, and the content of the second ceramic filler may be 5 wt % to 25 wt % of the total weight of the ceramic filler.

According to various embodiments, the core of the high heat dissipation filler may include at least one selected from a group consisting of carbon black, graphite, graphene, and carbon nanotubes.

According to various embodiments, the insulating coating layer may include silicon oxide.

According to various embodiments, the high heat dissipation filler may further include metal nanoparticles bonded to the surface of the core.

According to various embodiments, the metal nanoparticles may include at least one selected from a group consisting of nickel, copper, chromium, manganese, iron, cobalt, titanium, strontium, platinum, gold, and magnesium.

According to various embodiments, the total content of the ceramic filler and the high heat dissipation filler may be 80 wt % to 98 wt % of the total weight of the heat dissipation sheet.

According to various embodiments, the content of the ceramic filler may be 60 wt % to 80 wt % of the total weight of the heat dissipation sheet, and the content of the high heat dissipation filler may be 15 wt % to 35 wt % of the total weight of the heat dissipation sheet.

According to various embodiments of the disclosure, an electronic device may include: a housing including a front plate (e.g., the front plate 320 in FIG. 2) oriented in a first direction, a rear plate (e.g., the rear plate 380 in FIG. 2) oriented in a second direction opposite to the first direction, and a side member (e.g., the side bezel structure 331) surrounding a space between the front plate and the rear plate and at least partially formed of a metal material; a display (e.g., the display 330 in FIG. 2) visible through a portion of the front plate; at least one antenna module (e.g., the antenna module 390 in FIG. 2) disposed in the space; and at least one heat dissipation sheet (e.g., the heat dissipation sheet 610 in FIG. 6) disposed between the at least one antenna module and the rear plate. The at least one heat dissipation sheet may include a ceramic filler and a binder resin mixed with the ceramic filler.

According to various embodiments, the at least one heat dissipation sheet may further include a high heat dissipation filler including a core including a material having higher thermal conductivity than the ceramic filler, and an insulating coating layer surrounding at least a portion of a surface of the core.

According to various embodiments, the at least one antenna module may include a conductive radiator, and may be configured to transmit and/or receive a signal having a predetermined frequency band ranging from 6 GHz to 300 GHz via the conductive radiator.

According to various embodiments, the antenna module may include a first antenna module configured to radiate electromagnetic waves toward the rear plate, and a second antenna module configured to radiate electromagnetic waves toward the side member. The heat dissipation sheet may include a first heat dissipation sheet disposed to face at least a portion of the first antenna module, and a second heat dissipation sheet disposed to face at least a portion of the second antenna module.

A heat dissipation sheet according to various embodiments of the disclosure may include a ceramic filler, a high heat dissipation filler including a core including a material having higher thermal conductivity than the ceramic filler and an insulating coating layer formed to surround at least a portion of the surface of the core, and a binder resin.

According to various embodiments, the ceramic filler may include hexagonal boron nitride, the core of the high heat dissipation filler may include graphite, and the insulating coating layer of the high heat dissipation filler may include silicon oxide.

According to various embodiments, the binder resin may include at least one selected from a group consisting of isoprene rubber (IR), butadiene rubber (BR), styrene-butadiene rubber (SBR), ethylene propylene diene monomer (EPDM) rubber, acrylic rubber, and silicone rubber.

According to various embodiments, the content of the ceramic filler may be 60 wt % to 80 wt % of the total weight of the heat dissipation sheet, and the content of the high heat dissipation filler may be 15 wt % to 35 wt % of the total weight of the heat dissipation sheet.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
a front plate oriented in a first direction;
a rear plate oriented in a second direction opposite to the first direction;
at least one antenna module disposed between the front plate and the rear plate; and
at least one heat dissipation sheet spaced apart from the at least one antenna module and adhesively disposed on the rear plate, wherein the at least one heat dissipation sheet comprises:
a ceramic filler, and
a binder resin mixed with the ceramic filler.

2. The electronic device of claim 1, wherein the heat dissipation sheet further comprises a high heat dissipation filler comprising a core comprising a material including higher thermal conductivity than the ceramic filler and an insulating coating layer surrounding at least a portion of a surface of the core.

3. The electronic device of claim 1, wherein the ceramic filler comprises at least one selected from a group consisting of magnesium oxide, magnesium hydroxide, titanium dioxide, aluminum nitride, silicon nitride, boron nitride, hexagonal boron nitride, aluminum oxide, aluminum hydroxide, silica, zinc oxide, barium titanate, strontium titanate, beryllium oxide, silicon carbide, and manganese oxide.

4. The electronic device of claim 1, wherein the ceramic filler comprises hexagonal boron nitride.

5. The electronic device of claim 3, wherein the ceramic filler comprises:
a first ceramic filler including a grain size of 20 µm or more and 40 µm or less,
a second ceramic filler including a grain size of 10 µm or more and less than 20 µm, and
a third ceramic filler including a grain size of 1 µm or more and less than 10 µm.

6. The electronic device of claim 5, wherein:
a content of the first ceramic filler is 45 wt % to 65 wt % of a total weight of the ceramic filler,
a content of the second ceramic filler is 20 wt % to 40 wt % of the total weight of the ceramic filler, and
a content of the third ceramic filler is 5 wt % to 25 wt % of the total weight of the ceramic filler.

7. The electronic device of claim 2, wherein the core of the high heat dissipation filler comprises at least one selected from a group consisting of carbon black, graphite, graphene, and carbon nanotubes.

8. The electronic device of claim 7, wherein the insulating coating layer comprises silicon oxide.

9. The electronic device of claim 7, wherein the high heat dissipation filler further comprises metal nanoparticles bonded to the surface of the core.

10. The electronic device of claim 9, wherein the metal nanoparticles comprise at least one selected from a group consisting of nickel, copper, chromium, manganese, iron, cobalt, titanium, strontium, platinum, gold, and magnesium.

11. The electronic device of claim 2, wherein a total content of the ceramic filler and the high heat dissipation filler is 80 wt % to 98 wt % of a total weight of the heat dissipation sheet.

12. The electronic device of claim 11, wherein:
a content of the ceramic filler is 60 wt % to 80 wt % of the total weight of the heat dissipation sheet, and
a content of the high heat dissipation filler is 15 wt % to 35 wt % of the total weight of the heat dissipation sheet.

13. The electronic device of claim 1, wherein the at least one antenna module comprises a conductive radiator, and is configured to transmit and/or receive a signal including a predetermined frequency band ranging from 6 GHz to 300 GHz via the conductive radiator.

14. The electronic device of claim 13, wherein:
the antenna module comprises a first antenna module configured to radiate electromagnetic waves toward the rear plate, and a second antenna module configured to radiate electromagnetic waves towards a side member, and
the heat dissipation sheet comprises a first heat dissipation sheet disposed to face at least a portion of the first antenna module, and a second heat dissipation sheet disposed to face at least a portion of the second antenna module.

15. A heat dissipation sheet comprising:
a ceramic filler;
a high heat dissipation filler comprising a core comprising a material including higher thermal conductivity than the ceramic filler and an insulating coating layer surrounding at least a portion of a surface of the core; and
a binder resin.

* * * * *